US012739093B2

(12) United States Patent
Colombo et al.

(10) Patent No.: US 12,739,093 B2
(45) Date of Patent: Sep. 15, 2026

(54) ELECTRONIC DIGITAL SYSTEM COMPRISING A SERIALIZER DESERIALIZER MODULE, SERIALIZER DESERIALIZER MODULE AND METHOD OF CONTROL

(71) Applicant: STMicroelectronics International N.V., Plan-les-Ouates (CH)

(72) Inventors: Matteo Colombo, Monza (IT); Augusto Andrea Rossi, Pavia (IT); Jerome Deroo, Rives sur Fures (FR)

(73) Assignee: STMicroelectronics International N.V., Geneva (CH)

( * ) Notice: Subject to any disclaimer, the term of this patent is extended or adjusted under 35 U.S.C. 154(b) by 13 days.

(21) Appl. No.: 18/920,028

(22) Filed: Oct. 18, 2024

(65) Prior Publication Data

US 2025/0141653 A1 May 1, 2025

(30) Foreign Application Priority Data

Oct. 31, 2023 (IT) ........................ 102023000022986

(51) Int. Cl.
*H04L 7/00* (2006.01)
*H03L 7/085* (2006.01)
*H04L 7/033* (2006.01)
*H04L 7/04* (2006.01)

(52) U.S. Cl.
CPC .............. *H04L 7/005* (2013.01); *H03L 7/085* (2013.01); *H04L 7/0331* (2013.01); *H04L 7/048* (2013.01)

(58) Field of Classification Search
CPC ....... H04L 7/005; H04L 7/0331; H04L 7/048; H03L 7/085
See application file for complete search history.

(56) References Cited

U.S. PATENT DOCUMENTS 7,366,267 B1 * 4/2008 Lee ....................... H04L 7/0008 375/364
10,599,603 B1 * 3/2020 Agrawal ................ H03K 17/81
2010/0074386 A1 3/2010 Sakamoto et al.
2013/0170591 A1 * 7/2013 Su .......................... H04L 7/005 375/371

FOREIGN PATENT DOCUMENTS

WO 2005004378 A1 1/2005

OTHER PUBLICATIONS

IT Search Report and Written Opinion for priority application, IT Appl. No. 102023000022986, report dated Apr. 19, 2024, 7 pgs.

* cited by examiner

*Primary Examiner* — Janice N Tieu
(74) *Attorney, Agent, or Firm* — Crowe & Dunlevy LLC

(57) ABSTRACT

An electronic digital system includes a digital core and a Serializer Deserializer module. A FIFO device of the core reads and writes on a set of buses coupled to said Serializer Deserializer module. The Serializer Deserializer module transmits data read from the FIFO architecture device on a set of buses as a corresponding serial signals transmitted by transmitters. The serial signals and corresponding transmitters are logically grouped. The transmitters include PLL circuits generating PLL clocks, using as reference a cluster transmitter reference clock common, to a respective cluster of transmitters controlling a frequency of serialization operation and low frequency clocks obtained by the PLL clocks according to one or more groups corresponding to group of buses.

21 Claims, 8 Drawing Sheets

ELECTRONIC DIGITAL SYSTEM COMPRISING A SERIALIZER DESERIALIZER MODULE, SERIALIZER DESERIALIZER MODULE AND METHOD OF CONTROL

PRIORITY CLAIM

This application claims the priority benefit of Italian Application for Patent No. 102023000022986 filed on Oct. 31, 2023, the content of which is hereby incorporated by reference in its entirety to the maximum extent allowable by law.

TECHNICAL FIELD

The description relates to an electronic digital system comprising a digital core and a Serializer Deserializer module.

The digital core includes at least a device with a FIFO architecture, in particular a FIFO memory, written with a write clock and configured to transmit data read from said at least a FIFO architecture device with a read clock on a plurality of buses in parallel to said Serializer Deserializer module.

The Serializer Deserializer module is configured to transmit said data on a plurality of paths as a corresponding plurality of serial signals transmitted by a respective plurality of transmitters, said serial signals and the corresponding transmitters being logically grouped according to one or more group or clusters, the plurality of transmitters operating with respective transmitter clock signals which frequency and/or phase is determined by independent PLL circuits locally associated to each of said transmitters starting from a cluster common local transmitter reference.

One or more embodiments may be applied, e.g., to High-Speed Interfaces in Data-Center Networking Application or to Communication Networking.

BACKGROUND

High-Speed Interfaces for systems such as System on Chip (SoC) rely on systems that receive/transmits serial data. Typically, this may be embodied by Serializer Deserializer (SerDes) architectures in order to receive, manage and transmit high data-rate electrical serial data, typically in networking applications. A System on Chip comprising a Serdes and a digital core may receive the data from a receiver, for instance an optical receiver, and pass such data through a FIFO (First In First Out architecture) to a plurality of transmitters. The SerDes may be built with several serial data paths, one for each transmitter. Parallel data may be received, for instance, as optical aggregate data before a SerDes transmits disaggregated serial data on each path. SerDes devices may be transmitting as output more than one electrical data flow, all belonging to the same aggregate optical data. Therefore, the system including the SerDes may be required to autonomously match the transmission frequencies of the output transmitters. Doing so requires maintaining bounded phase relations between all the data flows (i.e., paths).

A known solution requires the use of phase interpolators with closed-loop control for each data-path, therefore keeping bounded phase relation across all the transmitters. Such solution with phase interpolators has been used with lower data-rate SerDes.

The solution with phase interpolators may be affected by systematic non-linear error due to intrinsic non-linear behaviour of the interpolation itself.

Also known as Integral Non-Linearity, this error impairs the Bit-Error-Rate overall performances, especially with higher data-rate SerDes devices.

There is a need in the art to contribute in dealing with a number of issues which are recognized to exist in a context as discussed in the foregoing.

SUMMARY

One or more embodiments may relate to a system.

One or more embodiments may relate to a corresponding Serializer Deserializer module and a method for controlling.

As mentioned previously, various embodiments of the present disclosure regard an electronic digital system comprising a digital core and a Serializer Deserializer module. The digital core comprises at least a FIFO architecture device, in particular a FIFO memory, written with a write clock and configured to transmit parallel data, read from said at least a FIFO architecture device with a read clock, on a set of buses to said Serializer Deserializer module. The Serializer Deserializer module is configured to transmit said data read from said at least a FIFO architecture device on a set of buses as a corresponding set of serial signals transmitted by a respective set of transmitters, said set of serial signals and the corresponding set of transmitters being logically grouped according to one or more group or clusters, in particular corresponding to one or more group of buses.

The set of transmitters comprise respective independent PLL circuits issuing respective PLL clock signals, using as reference a cluster transmitter reference clock common to a respective cluster of transmitters controlling a frequency of operation, in particular serialization, of said transmitters and a set of low frequency clock signals obtained by said PLL clock signals, in particular by frequency division.

The system further comprises: a digital frequency correction module configured to supply to each independent PLL circuit a data strobe encoded frequency correction signal specifying a command for a frequency correction obtained from a detected phase error, detected by an error detection module comprised in said digital core, between the write clock and the read clock, said read clock corresponding to one of said PLL low frequency clock signals.

The digital frequency correction module comprises one or more cluster digital frequency correction sub-modules corresponding to a respective cluster, clocked by a respective cluster clock signal, in particular corresponding to said transmitter cluster reference clock, configured to receive and process a respective data strobe encoded cluster frequency correction comprising said frequency correction obtained from a detected phase error, outputting a respective correction signal from which data strobe encoded frequency correction signals for each of said transmitters are obtained, in particular by demultiplexing.

Each of said transmitters is configured to assert respective acknowledge signals when receiving said respective data strobe encoded frequency correction signals signal specifying a command for a frequency correction.

Each cluster digital frequency correction sub-module comprises a handshake module receiving a set, in particular a bus, of said acknowledge signals by the respective transmitters, which are in resynchronized with said cluster clock signal, said handshake module being configured to issue said output data strobe encoded frequency correction signal as asserted to command frequency correction of the respective transmitters upon receival of a set of de-asserted acknowledge signals, resynchronized with said cluster clock signal, from all the enabled transmitters of the cluster, said transmitters being configured to de-assert said acknowledge signals upon completion of a number cycles of a frequency correction on the frequency of all the independent PLL circuits of the corresponding cluster.

In embodiments, said transmitters of a cluster are programmable with a same number of cycles and they are configured to maintain the respective acknowledge signals from all the enabled transmitters asserted for a duration corresponding to said number of cycles.

In embodiments, said handshake module is configured to send repeatedly said data strobe encoded frequency correction signal asserted to command frequency correction of the transmitters of a cluster.

In embodiments, said handshake module is configured to send once said data strobe encoded frequency correction signal asserted to command frequency correction of the respective transmitters, the transmitter performing the frequency correction over said programmed said number of cycles.

In embodiments, upon receival of said set of asserted resynchronized acknowledge signals, from all the enabled transmitters of the cluster acknowledging performing a frequency correction on the frequency of all the independent PLL circuits of the corresponding cluster said handshake module is configured to implement a handshake communication protocol also with said digital core module which sends to said cluster digital frequency correction sub-module said frequency correction obtained from a detected phase error, said handshake module sending a respective cluster frequency correction acknowledge signal to said core module, said cluster frequency correction sub-module acknowledge signal enabling said core to send a next frequency correction.

In embodiments, said write clock is a recovered clock signal recovered from data received upstream said FIFO architecture device.

In embodiments, said PLL circuits are implemented by fractional sigma delta PLL circuits, comprising a respective sigma delta modulator comprising a respective handshake module configured to receive said data strobe encoded frequency correction signals for each of said transmitter signals specifying a command for a frequency correction, said sigma delta modulator being configured to modify its input to the PLL loop of said PLL circuit with said frequency correction.

In embodiments, said each frequency correction sub-module comprises a synchronizer to synchronize said set, in particular a bus, of acknowledge signals with said cluster clock signal cluster clock signal.

In embodiments, said each frequency correction sub-module comprises also a synchronizer to synchronize said frequency correction signal from said digital core with said cluster clock signal, in particular synchronize a strobe of said frequency correction signal.

In embodiments, said each frequency correction sub-modules comprises a filter, in particular a IIR filter, which filters the resynchronized frequency correction signal before entering said handshake module.

In embodiments, the set of cluster digital frequency correction sub-modules is configured to send a data strobe encoded output signal to a Cluster to Logical Data-Slice cross-bar configured to issue said data strobe encoded frequency correction request signal to said transmitters based on their grouping, under the control of a configuration bus signal, which indicates to which cluster each data slice belongs, issued by said register map, which is in particular programmable.

In embodiments, said digital frequency correction module comprises a map register module in which the grouping in cluster is stored.

In embodiments, said phase error is supplied as frequency correction between such signals by a proportional integral phase correction module, which applies a proportion integrative correction having the phase difference as input, followed by a frequency correction module issuing said data strobe encoded frequency correction signal.

In embodiments, the digital frequency correction module comprises a configuration manager, which is configured to indicate, indicating for each cluster which transmitter is active on the basis of a setting signal which indicates, which cluster each transmitter belongs to, of a setting signal indicating which transmitter is enabled with respect to the respective frequency correction sub-modules.

In embodiments, said transmitter cluster reference clock is selected in a set of available clock signals and said cluster digital frequency correction sub-module is clocked by a clock selected in said set of available clock signals, in particular corresponding to the transmitter reference clock selected for the corresponding cluster.

In embodiments, the solution refers also to a Serializer Deserializer module configured to received parallel data read from at least a FIFO architecture device with a read clock on a set of buses to said Serializer Deserializer module. The Serializer Deserializer module is configured to transmit said data read from said at least a FIFO architecture device on a set of buses as a corresponding set of serial signals transmitted by a respective set of transmitters, said set of serial signals and the corresponding transmitters being logically grouped according to one or more group or clusters, in particular corresponding to one or more group of said buses.

The set of transmitters comprises respective independent PLL circuits issuing respective PLL clock signals, using as reference a cluster transmitter reference clock common to said transmitters controlling a frequency of operation, in particular serialization, of said transmitters and a set of low frequency clock signals obtained by said PLL clock signals, in particular by frequency division, wherein said Serializer Deserializer module is configured to operate in the system according to embodiments.

In embodiments, the solution refers also to a method for controlling a system according to any of the previous embodiments, comprising: supplying to each independent PLL circuit a data strobe encoded frequency correction signal (specifying a command for a frequency correction obtained from a detected phase error comprised in said digital core, between the write clock and the read clock, said read clock corresponding to one of said PLL low-frequency clock signals; performing at respective one or more cluster digital frequency correction sub-modules corresponding to a respective cluster receiving and processing a respective data strobe encoded cluster frequency correction, receiving also a respective clock signal, in particular the transmitter reference clock selected for the corresponding cluster; asserting respective acknowledge signals at each of said transmitters when receiving said data strobe encoded frequency correction signal specifying a command for a frequency correction; and receiving at said respective one or more cluster digital frequency correction sub-modules a set, in particular a bus, of said acknowledge signals, resynchronized with said cluster clock signal, by all the enabled transmitters of the cluster, issuing said data strobe encoded cluster frequency correction signal as asserted to command frequency correction of the respective cluster transmitters upon receival of a resynchronized set of de-asserted acknowledge signals from all the enabled transmitters of the cluster, de-asserting said acknowledge signals upon completion of a number cycles of a frequency correction on the frequency of all the independent PLL circuits of the corresponding cluster.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
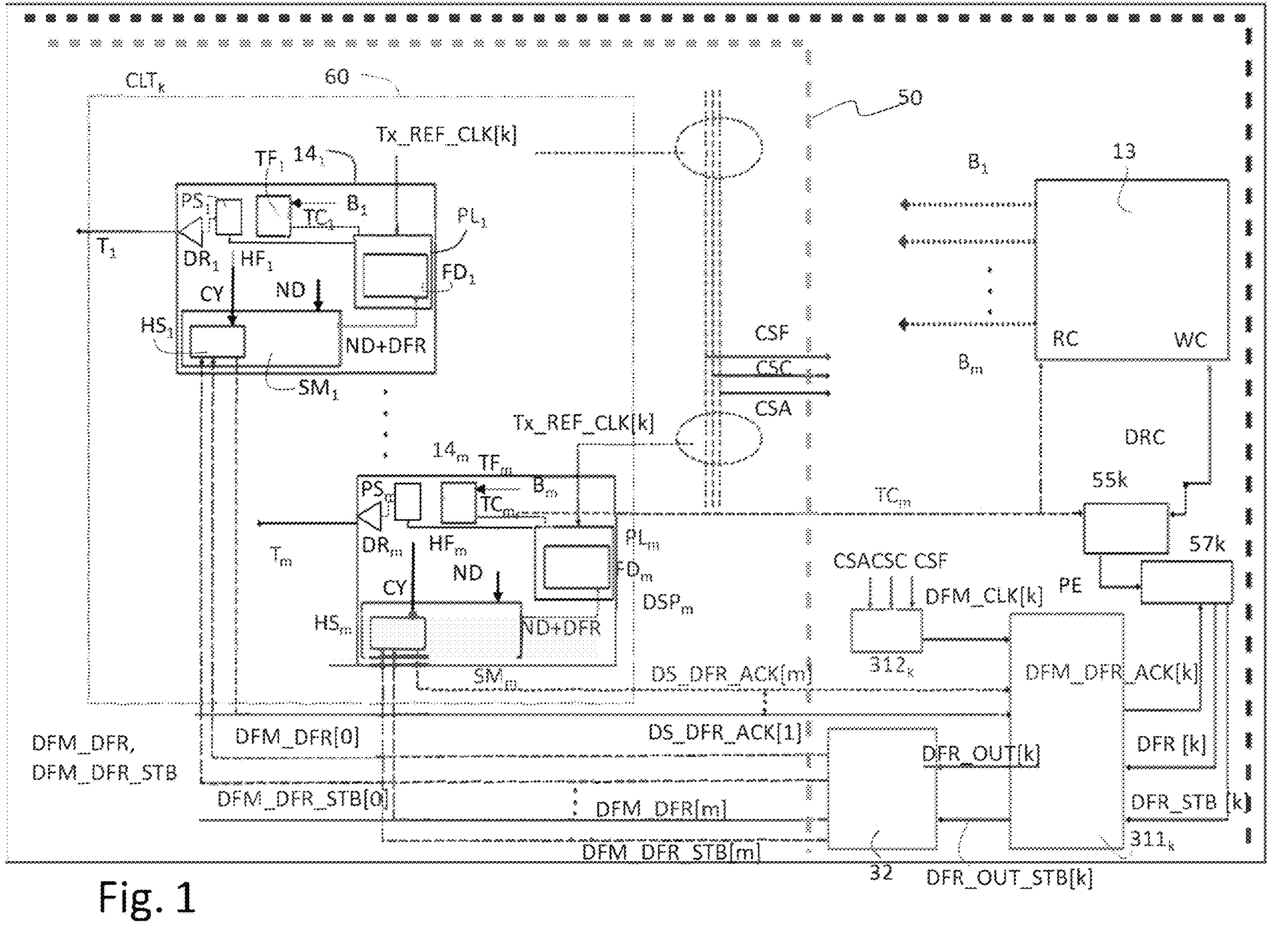
FIG. 1 schematically represents an electronic system.

FIG. 1 shows schematically an embodiment of a serial data link architecture.

A digital electronic system 11, e.g., a System On Chip, includes a Serializer/Deserializer device 60, also referred to as a SerDes module, to transmit serial data at a high data rate, thus realizing a high speed interface for the system 11. The system 11 comprises also a digital core 50, which may correspond to a network communication device.

The digital core 50 comprises at least a device with a first in first out (FIFO) architecture 13, or FIFO architecture device, in particular a FIFO memory or buffer, written with a write clock DRC supplied at a write clock input WC, which is in particular a Data Recovery clock obtained from input data received upstream the FIFO architecture 13, and configured to transmit parallel data read from said FIFO architecture 13 with a read clock, supplied at a read clock input RC and indicated with $TC_m$, on a plurality of buses $B_1, \ldots, B_m$ to said Serializer Deserializer module 50. As better detailed in the following, $TC_m$ indicates a PLL clock low, or divided, frequency selected in the SerDes 60. Since the solution here described, as indicated, regards the control of the SerDes 60 with respect to the function of serializing the data from the plurality of buses $B_1, \ldots, B_m$, in FIG. 1, the digital core 50 is represented partially only with reference to components, modules and signal which are relevant for the solution here described, such as the FIFO memory 13 outputting the plurality of buses $B_1, \ldots, B_m$.

Also, the SerDes 60 is shown only with reference to its transmitting portion serializing the parallel data from the plurality of buses $B_1, \ldots, B_m$, namely a transmitter portion 14, which operates under control of the solution here described, namely a digital frequency correction module 30, or DFM 30, preferably comprised in the digital core 50, as better described in the following.

The Serializer Deserializer 60 is thus configured to transmit said parallel data on the plurality of buses $B_1, \ldots, B_m$ as a corresponding plurality of serial signals $T_1, \ldots, T_m$ transmitted by a respective plurality of transmitters $\mathbf{14}_1, \ldots, \mathbf{14}_m$.

According to an aspect of the solution here the described, the serial signals $T_1, \ldots, T_m$ and the corresponding transmitters are logically grouped according to one or more groups or clusters $CLT_k$, k being the cluster index, which can vary between 1 and p. Such logical grouping means that the serial signals $T_1, \ldots, T_m$ output by the transmitters are logically mapped as corresponding to different clusters by the DFM 30, each cluster $CLT_k$ comprising a portion of the total serial signals outputted $T_1, \ldots, T_m$ by the SerDes module 60, also indicated as logical data slices. FIG. 1 shows only a cluster comprising the serial signals $T_1, \ldots, T_m$, with m=8 in the example shown, although in general there may be more clusters (or equivalently more SerDes represented by one respective cluster). In other words, the SerDes 60 may comprises a plurality of clusters $CLT_k$ operating on respective group of serial signals $T_1, \ldots, T_m$ (the value of m can vary from cluster to cluster), and each transmitter **14*i* can be seen as portion of a respective SerDes, i.e., in the figure SerDes 60 may be considered as comprising m SerDes modules, each operating on a bus $B_i$ and outputting a serial signal $T_i$. Also, a transmitter 14*i***, corresponding to a SerDes, is referred to here also as data slice, and the corresponding PLL divided output clock $TC_i$ as digital data slice clock.

The low frequency, or divided, output clock $TC_i$ represents the clock for the digital part of the transmitter **14*i*** and in the example it is derived as divided frequency, i.e., low frequency, of a PLL high-frequency output $HF_i$. Hence, it is a low frequency PLL clock $TC_i$ as opposed to the high frequency clock $HF_i$. In embodiments the low frequency output clock TC is obtained by dividing the high frequency clock $HF_i$, although other methods may be possible to obtain a high frequency clock and low frequency clock from a phase lock loop (PLL), e.g., frequency multiplication. The high-frequency output $HF_i$ is instead used for the output serial (analog) data, therefore clearly distinguishing between analog and digital parts of the data-slice. For example, a FIFO $TF_i$ inside a transmitter is clocked with the digital clock, i.e., divided output clock $TC_i$, while the transmitter serial output buffer, e.g., $PS_i$, sends serial data in the form of high-speed analog waveform, clocked by the PLL high frequency output or PLL high-frequency output $HF_i$.

It is underlined also that the FIFO architecture 13 may comprise a FIFO for each cluster, with a divided, or low frequency, clock signal $TC_m$ from the respective cluster as read clock, i.e., as many read clocks as clusters.

The Serdes 60, or each of the m SerDes modules indicated by the respective transmitter 14$_i$, in general comprises both a serializer portion, serializing each received parallel-data signal and comprising the transmitter 14, and a deserializer portion, which receives serial signals, e.g., from an external communication node, usually from another SerDes, and parallelizes each of them into a respective parallel-data flow. The parallel-data are the bits, or symbols, parallelly processed at the same time with the low-frequency digital clock and corresponding to a number of serial-data symbols processed each with the high-frequency PLL clock. That number is also proportional the division ratio by which the low-frequency clock is obtained from the high-frequency clock. In FIG. 1, however, for simplicity's sake it schematizes only the transmitting portion 14, i.e., the portion receiving the bus.es $B_1, \ldots, B_m$, serializing the data therein and transmitting them over a communication channel as serial signals $T_1, \ldots, T_m$.

The i-th, i=1, . . . , to m, transmitter 14; (in the figure are shown the transmitters with i=1 and i=8 representing the extremes of the set of transmitters 14$_1$, . . . , 14$_m$) comprises a PLL circuit comprising a PLL loop $PL_i$. The PLL loop $PL_i$ is not shown in FIG. 1 in full, however it may be a standard loop, e.g., receiving a reference clock Tx_REF_CLK(k), i.e., a common reference clock for the cluster k, and supplying an error or difference, e.g., by a difference block, to a loop filter, and then to a Voltage Controlled Oscillator (VCO), outputting a PLL output clock $HF_i$ frequency, which in general is used to clock the operation of a serializer, or parallel to serial converter, $PS_i$. As noted, the PLL output clock $HF_i$ frequency, which depends from the reference frequency Tx_REF_CLK(k), is a high-frequency clock, supplied to the serializer $PS_i$, in order to transmit at a higher frequency than the frequency of the PLL low frequency clock $TC_i$ supporting a required high serial data rate. By way of example, the PLL loop $PL_i$ is based on a high-frequency VCO, for example 28 GHz, which is divided to run the digital part of the transmitter, for example at division ratio of 16, that is at 28 GHz/16=1.75 GHz. This division is performed externally to the PLL $PL_i$ and outputs the PLL low frequency clock $TC_i$. In the figure, for simplicity, such divider is not shown, thus the PLL low frequency clock $TC_i$ is shown as originated by the PLL $PL_i$ block. The PLL output clock frequency $HF_i$ is also fed back in the loop $PL_i$, through a frequency divider $FD_i$ to the difference block to be subtracted from the reference frequency Tx_REF_CLK(k). Such frequency divider $FD_i$ receives a corrected average frequency division value ND+DFRV from a sigma delta modulator $SM_i$, which receives a nominal division value ND as input, e.g., from a not shown controlling logic in the system or digital core. DFRV indicates the frequency correction value, i.e., the correction value calculated by block 57*k*, sent from the corresponding cluster module 311*k*. The term "average" refers to the fact that the frequency divider $FD_i$ is just an integer divider which is dynamically modulated in terms of its integer division ratio in order to obtain a divided clock output which, according to its dynamically modulated frequency, has an "average" frequency obtained as if the frequency divider $FD_i$ was virtually driven by ND+DFRV.

The frequency divider $FD_i$ is internal to the PLL $PL_i$ and it is not to be confused with the external divider outputting PLL low frequency clock $TC_i$, and instead produces a comparison clock used as one of the two inputs for the difference block in the PLL $PL_i$ and also as the clock of the sigma delta modulator $SM_i$ as discussed below.

Thus, the sigma delta modulator $SM_i$ is configured to supply to the frequency divider $FD_i$ as setting value the nominal frequency division value ND summed to the frequency correction average value DFRV. Since the corrected average frequency division value ND+DFRV may be and usually is not an integer, the sigma delta modulator $SM_i$ and the PLL loop $PL_i$ provide a Sigma-Delta based Fractional Phase-Locked Loop. The frequency correction value DFRV may be the cumulative value of the current and the previous frequency correction requests. For instance after the first frequency correction request is correctly applied, the low-frequency clock $TC_i$ runs without phase error (steady-state) with respect to the write clock WC, as long as the write clock WC moves further, for any external reason, such as temperature variation, yielding a new phase error detected relatively to the previous steady-state and therefore requiring to be summed up with the previous corrections in order to provide the correct frequency correction value DFRV to be added to the fixed value of the nominal frequency division value ND.

In FIG. 1, the sigma delta modulator $SM_i$ comprises a transmitter handshake module $HS_i$, which will be better described in the following. As indicated, the modules with the i subscript refers to the i-th transmitter 14$_i$. In the i-th transmitter 14$_i$ it is shown also a respective FIFO memory $TF_i$, which may be used to receive the data on the corresponding bus $B_i$, and, then fed to the serializer $PS_i$, which obtains a serial signal, output by the transmitter 14*i* through a driver $DR_i$ as serial signal $T_i$.

In the following when referring to the PLL circuit, for simplicity is referenced the PLL loop $PL_i$ outputting the PLL clock, i.e., high frequency PLL clock $HF_i$, although in general the PLL circuit may be seen as comprising at least also the sigma delta modulator $SM_i$ and thus the transmitter handshake module $HS_i$. By way of example for implementation, a classical Sigma-Delta MASH III block may be modified to allow for an input correction and a hand-shake mechanism.

The data recovery clock DRC operates in a respective clock domain, a write clock domain.

The read outputs of the FIFO 13 are then clocked by a transmitter digital clock signal, i.e., the PLL low frequency clock $TC_m$ which is taken from one of the PLL low-frequency clock signals, $TC_1, \ldots, TC_m$, of the output transmitters 14, specifically 14$_1$ to 14$_m$, which receive the signals at the output of the read outputs of the FIFO 13 and transmit transmitted serial data $T_1, \ldots, T_m$—with a high data rate clock depending on PLL clock signals, i.e., high frequency, $HF_1, \ldots, HF_m$, issued by the PLL $PL_i$ to operate the serialization of the data, to modules, e.g., network modules, coupled to the output of the SerDes transmitters 14$_1$, . . . , 14$_m$ through communication channels, or paths. The SerDes transmitters 14$_1$, . . . , 14$_m$ receive as reference clock of the PLL $PL_i$, a same transmitter common cluster local reference clock Tx_Ref_Clock(k), while their output clock signals and the related digital (low frequency) clocks, $TC_1, \ldots, TC_m$, are controlled in their clock frequency value by a digital frequency correction module 30, also identified as Delta Frequency Manager (DFM) module, where Delta indicates the frequency difference or correction applied to one or more of such output clock signals or, equivalently to the PLL clocks $TC_1, \ldots, TC_m$. The frequency correction values DFRV, i.e., $DFRV_k$ for the k-th cluster may be seen as a fractional part added to the respective division ratio, i.e., nominal frequency division value, ND, thus causing the PLL high-frequency output, $HF_i$, and its externally divided counterpart, PLL low frequency clock $TC_i$ to be corrected. It is emphasizes here that the nominal frequency division value ND can be integer or, due to Sigma-Delta modulation, an average fractional ratio.

Figure 3:
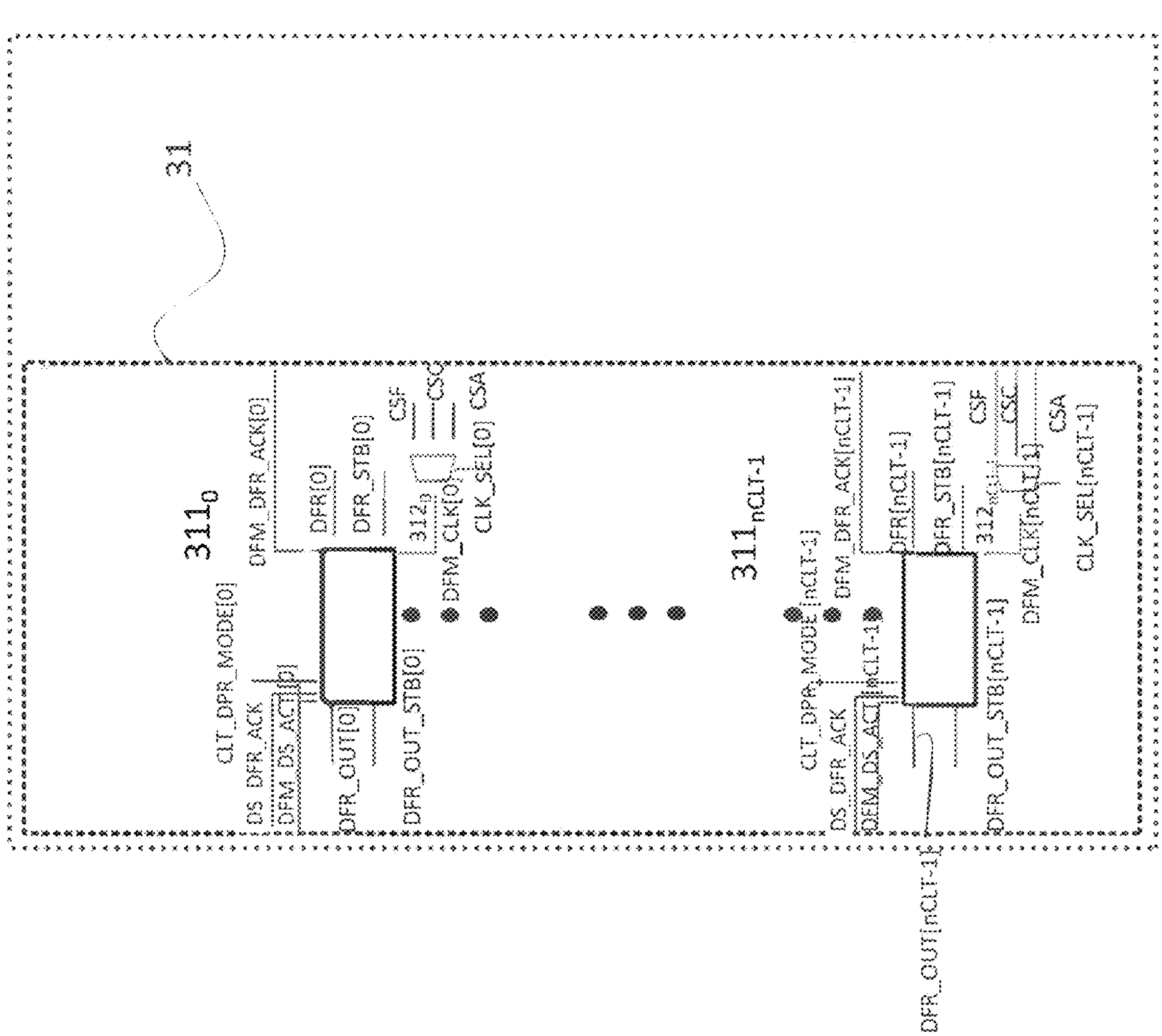
FIG. 3 is schematical representation of a cluster frequency correction module comprised in said frequency correction module.

Then in FIG. 1, a phase detector 55*k* receives the data recovery clock DRC, i.e., the write clock of the FIFO 13, and the transmitter digital clock $TC_m$ (here for simplicity is indicated the m-th clock $TC_m$, but could be any of clocks $TC_1, \ldots, TC_m$ in the cluster) selected as read clock of the FIFO 13 outputting a phase error PE, i.e., between the write clock and the read clock of the FIFO 13 to a frequency correction module 57*k*. The index k for modules 55*k* and 57*k* indicates that an instance of such modules is provided for each k-th cluster. The frequency correction module 57*k* issues a data strobe encoded frequency correction DFR(k), DFR_STB(k) signal to a cluster digital frequency correction module 311*k*, i.e., for a respective k-th cluster. As better described in the following the cluster digital frequency correction modules 311*k* are comprised in a digital frequency correction module 30, in particular, as shown in FIG. 3, in a cluster set digital frequency correction modules 31, which however can be seen as a logical container housing the set of cluster digital frequency correction modules 311*k*.

The data strobe encoded frequency correction DFR(k), DFR_STB(k) signal comprises a data signal, the frequency correction signal DFR(k), sent on a signal bus line, and its strobe frequency correction signal DFR_STB(k), sent on another signal line, which altogether represent a data strobe or D/S encoded signal using such two signals as the data and strobe lines. In the following when referring to a data strobe encoded signal it will be made reference thus to such a signals with two signals on two lines, e.g., unless the description refers to a specific use of one the two signals, data or strobe.

The frequency correction module 57*k* may operate to perform a proportional integrative correction on the phase error PE and then a differentiation, to obtain the correction value DFR V in the data strobe encoded frequency correction DFR(k), DFR_STB(k). The encoded frequency correction data signal DFR(k) may be a signal equal to zero when the detected phase error PE is zero or equal to the value DFRV when the detected phase error PE is not zero. Once detected, the k-th value $DFRV_k$ for the k-th cluster is put on the signal DFR(k) line bus and, after it stabilizes on all the bits that compose that bus, a strobe is raised on the encoded frequency correction strobe DFR_STB(k) single-bit line to flag that the signal carrying the k-th value DERVk is stable. During the high-level of the strobe, no change is allowed on the encoded frequency correction data signal DFR(k) line bus. For this reason, among others, it may be used the acknowledgement signal DFM_DFR_ACK (k) to flag to the Core 50 that the encoded frequency correction strobe DFR_STB(k) can be reset. If the acknowledgement signal DFM_DFR_ACK (k) is not used then the strobe DFR_STB (k) may be reset on the basis of predetermined settings, such as the latency introduced by the DFM and Data-Slice hand-shake (e.g., their sum). Such modules 55*k*-57*k* are, in the example and preferably, comprised in the digital core 50 which is part for instance of the system 11, in the example a System on Chip including also the SerDes 60, i.e., to implement a high-speed interface for the system 11.

In the following, it will be remembered that at each k-index correspond m indexes from 1, through i, to m. These m indexes are referred to the k-th cluster through a cross-bar 32 demultiplexing operation, described in detail with reference to FIG. 6.

Each cluster digital frequency correction module 311*k* as better detailed in the following, through the de-muxing operated by the cross-bar 32, sends a respective frequency correction request signal DFM_DFR[i] and a corresponding frequency correction request strobe signal DFM_DFR_STB [i] to the respective transmitter 14*i*, or data slice, specifically to the sigma delta modulator $SD_i$ and its transmitter handshake module $HS_i$. The transmitter handshake module $HS_i$ when receives respective frequency correction request signal DFM_DFR[i] and a corresponding frequency correction request strobe signal DFM_DFR_STB[i] specifying a command for a frequency correction DFRV (data value on the data line DFM_DFR[i] and strobe asserted DFM_DFR_STB [i]) responds with a respective acknowledge signal DS_DFR_ACK[i]. The frequency correction request signal is a data strobe or D/S encoded signal using such two signals as the data and strobe lines.

The transmitter handshake module $HS_i$ receives a cycles value CY, which may be programmed in a data-slices register map 34, described with reference to FIG. 2, and which indicates for how many cycles of the PLL clock at the output of the frequency divider $FD_i$ (clocking the sigma delta modulator SM; and the transmitter handshake module $HS_i$) the transmitter handshake module $HS_i$ maintains the respective acknowledge signal DS_DFR_ACK[i] asserted and, for the same duration, hold a respective value DRFV, in particular DFR Vi applied to the sigma delta modulator $SM_i$.

Now, on the basis of the system described with reference to FIG. 1, the associated Data-Recovered Clock DRC can be different from SerDes transmitter digital clocks, PLL divided clock signals $TC_1, \ldots, TC_m$, which are generated by local independent Phase-Locked Loops (PLL) $PL_i$ and starting from a common local reference clock, i.e., Tx_REF_CLK. This, in particular, if the data written in the FIFO 13 arrives from a different physical (e.g., geographical) location. Indeed, by way of not limiting example, although not shown in FIG. 1, the system 11 may receive the data from an external receiver, e.g., an optical receiver, receiving input data, which may be aggregated data transmitted on an optical fiber by a data transmitter remotely located, i.e., in a different physical or geographical location, in a remote communication node or system. These input data may be received by the optical receiver, which operates with a receiver clock reference signal, and may obtain from the input aggregated data, a plurality of parallel data signals on a plurality of data buses, which may be brought to the corresponding write inputs of the FIFO memory 13. A clock recovery module may be configured to obtain the write clock, i.e., data recovery clock DRC for the write inputs. Such local independent Phase-Locked Loops, $PL_1, \ldots, PL_m$ thus output PLL low frequency divided clock signals $TC_1, \ldots, TC_m$ which usually belong to another clock domain. This another clock domain may be composed from the set of the sigma modulator $SM_i$ clocks, as outputted from each divider $FD_i$.

As said, this is a not limiting example, as there may be other reasons or architecture determining that the write clock have a difference with respect to the SerDes PLL divided clock signals. In general, the write clock can be different with respect to the SerDes divided clocks due to experiencing physical variations on the remote transmitter before sending data into the fiber, i.e., it is related to physical changes over time.

Therefore, the difference between Data-Recovered Clock DRC and SerDes transmitter clocks, PLL low frequency divided clock signals $TC_1, \ldots, TC_m$, must be detected and compensated by resynchronizing all the transmitters $\mathbf{14}_1, \ldots, \mathbf{14}_m$, which shall read data at the same rate while avoiding any phase drift. In fact, such a drift prevents data from being correctly transferred across the FIFO buffer or memory 13.

According to an aspect of the solution here described, the phase error PE is detected by block 55*k* with respect to only one of the PLL low frequency divided clock signal, in the example the m-th PLL low frequency divided clock signal $TC_m$ (in the example m=8, thus $TC_8$), and on the basis of such phase error PE is applied the compensation, i.e., frequency correction request signal DFM_DFR through the respective cluster digital frequency correction module $\mathbf{311}_k$, and through the demultiplexing block 32, to all the high-frequency PLL outputs $HF_i$ and, as a consequence, to all the output PLL low frequency divided clock signals $TC_1, \ldots, TC_m$ of the transmitters $\mathbf{14}_1, \ldots, \mathbf{14}_m$ of the k-th cluster.

Compensating the frequency error however may not be sufficient to correctly read data because a bounded phase difference across all the transmitters $\mathbf{14}, \ldots, \mathbf{14}_n$ cannot be guaranteed due to misalignment in applying the compensation.

Therefore, according to the solution here described, a hand-shake mechanism is implemented, between the transmitter handshake module and the cluster digital frequency correction module $\mathbf{311}_k$ in the DFM 30, as better described in the following, as a solution to make sure that the frequency compensations are applied for the same duration, guaranteeing in this way the frequency update and a bounded phase difference. As it will be shown, basically when a set of values DFRV (DFRV[k] is the single value for the cluster with the k-th index) is applied from the core 50, e.g., module 57*k* to the DFM 30, for each k-th cluster the module 311*k* in the DFM 30 asserts the strobe signal, DFR_OUT_STB[k], and processes the correction value DFRV[k] to output the DFR_OUT[k] signal. Then, a cross-bar 32, or Cluster to Logical Data-Slice cross-bar since it performs de-multiplexing of the signals from the cluster to the appropriate logical data slice, i.e., i-th transmitters or elementary SerDes, is thus configured to issue the respective frequency correction request signal DFM_DFR[i] and a corresponding frequency correction request strobe signal DFM_DFR_STB[i], i.e., D/S encoded signal, to the transmitters 14 of the corresponding cluster. Then, at the cluster digital frequency correction module $\mathbf{311}_k$, there is a wait for the set of acknowledge signals of the data slices, i.e., transmitters $\mathbf{14}_1, \ldots, \mathbf{14}_m$ of the cluster, to rise to de-assert the strobe signal DFR_OUT_STB[k]. Then, there is a wait for the set of acknowledge signals of the data slices, DS_DFR_ACK[k] to go down, i.e., de-assert, for instance going to logic zero. The set of the acknowledge signals is, in particular, a bus including the DS_DFR_ACK[i] signals, with i-index from 1 to m, belonging to the k-th cluster.

It is emphasized that the frequency correction command, i.e., DFR_OUT[k], DFR_OUT_STB[k] may be repeatedly applied, i.e., repeatedly strobed, by the cluster module $\mathbf{311}_k$ in the DFM 30 to the transmitters of the corresponding cluster $CLT_k$ such that all the transmitters, i.e., data slice, belonging to the same cluster $CLT_k$ operate at the new required frequency. The repetition allows to have a steady-state in terms of reaching the new-frequency of PLL operation. The application of each repetition for the same duration across PLLs in the cluster CLTk allows to operate without accumulating unbounded phase difference. Between repetitions a null-command time gap is inserted. Such gap null-command time gap allows for a delay for all of the signals in the set of DS_DFR_ACK[i] signals rise or fall before a DFR_OUT_STB[k] is respectively de-asserted or newly asserted. The gap is indeed the time duration between DFR_OUT_STB[k] de-assertion and new assertion.

When a new command, i.e., signal DFR[k], DFR_STB[k] is provided to a cluster digital frequency correction module $\mathbf{311}_k$, this is applied according to a latency, which bigger part is usually the latency of the transmitter $\mathbf{14}_i$.

If a transmitter $\mathbf{14}_i$ is busy with the previous command, i.e., previous frequency correction, the new command DFM_DFR[i], DFM_DFR_STB[i] is applied as soon as the transmitter $\mathbf{14}_i$ is idle, e.g., its DS_DFR_ACK[i] is de-asserted (latency). The new command can be lost in case of too high-rate commands. If the transmitter $\mathbf{14}_i$ is idle, the new command DFM_DFR[i], DFM_DFR_STB[i] is applied, by asserting its strobe signal.

An expected command rate can be 10-100 kHz. Higher frequency noise filtering is provided with bandwidth programming capabilities.

Implementation is dependent on number of clusters p and number of data slice m. The number of cluster DFM modules 311*k*, which represent Command Interfaces, is p. The number of transmitters 14*i*, each of which may represent a respective Serdes within the Serdes 60, is m.

Given the implementation, it is required to: provide the setup configuration to the DFM 30 in order to control clusters $CLT_k$ with the corresponding cluster DFM modules 311*k*; and provide the "Delta-Frequency" command from the core 50, i.e., DFR[k] to each cluster DFM module 311*k*.

As a particular Use Case implementation: p=1, m=N, i.e., one only cluster with a plurality N of data slices.

According to a further aspect of the solution, a Sigma-Delta based Fractional Phase-Locked Loop, as described with reference to FIG. 1, a circuit which synthesizes an electrical oscillation with high resolution, is used as independent phase locked loops circuit $PL_i$ (or the combination of the sigma delta modulator SM; and PLL loop $PL_i$) and issuing high-frequency PLL outputs $HF_i$ which, through dedicated external dividers, provide the clock signals $TC_1, \ldots, TC_m$. The modules 311*k* in the digital frequency correction module 30 represent the digital block supplying the frequency correction DFRV, i.e., a frequency value update, to all independent phase locked loops $PL_1, \ldots, PL_m$ of the transmitters $\mathbf{14}_1, \ldots, \mathbf{14}_m$.

The DFM 30 thus controls the PLL internal frequency divider $FD_i$, ratio through the Sigma-Delta Modulator modified input, i.e., nominal divider ratio ND modified by the frequency correction DFRV. The frequency correction DFRV, Q-6.20 fixed-point notation, is added to the nominal divider ratio ND, by way of example with the following specifications: LSB=1/32 ppm; Range=+/−512 ppm; Minimum Latency=128 Cycles (i.e., Sigma-Delta Hand-Shake module $HS_i$ is busy, i.e., DS_DFR_ACK[i]=1, for such Minimum Latency; and Programmable number of Cycles CY (from 128 to 8192, powers of 2 only).

In particular, the fractional sigma delta PLL circuits $SM_1, \ldots, SM_m$ are configured to perform frequency synthesis through full precision division ratio, comprising in particular an unsigned number (U6.20 fixed-point notation, where the letter "U" stands for "unsigned" number) with 6 bits for the integer part and 20 bits for the fractional part, according to the following model equation for the division ratio: Nint+FRAC/MOD, where Nint is an integer part of division ratio, FRAC/MOD:fractional part, and FRAC<MOD=2^20-1.

Being the Q-6.20 correction value a 20−6=14 bits number with a further bit used for the sign (the letter "Q" reminds for that), the Sigma-Delta PLL circuit shall account negative corrections as well. And, in case this negative correction is enough to also require a change for the Nint, the circuit shall also perform that change. The correction is therefore a 15 bits signed number (Q-6.20:1 bit for the sign, 14 bits for the absolute correction) which is added to the nominal U6.20 value, according to signed arithmetic rules.

The frequency correction DFRV is applied to all PLLs in a cluster for the same number of cycles CY, which as shown in FIG. 1 is a value set in the delta sigma modulator $SM_i$, and repeatedly until a new command is available.

As mentioned, a time gap between repetitions ensures that all the data slices, i.e., transmitters $\mathbf{14}_i$, in a cluster have terminated the number of programmed cycles CY and so a new command can be processed again and repeatedly for the programmed cycles CY.

Thus, on the basis of the circuit of FIG. 1 described so far, the digital frequency correction module 30 operates to align the frequency of the clock signals $TC_1, \ldots, TC_m$ output by dividing the PLL high-frequency outputs through dividers external to the circuits $PL_1, \ldots, PL_m$, each receiving a common local reference-clock i.e., Tx_REF_CLK. This is performed for each data slice, i.e., transmitter $\mathbf{14}_1, \ldots, \mathbf{14}_m$ outputting serial signals $T_1, \ldots, T_m$, grouped in a given cluster k, on the basis of the phase error PE between the read clock, e.g., $TC_m$, and the write clock, e.g., DRC. This frequency alignment control is used to avoid failure into the data-flow reading-from and, respectively, writing-to the FIFO architecture 13. Any misalignment (e.g., a temperature change in the remote optical transmitter) is phase-detected, producing phase error PE, and then a frequency correction DFRV, for instance through a Proportional-Integrative controller, e.g., a block which also may be contained or permitted to block 57*k*, then differentiated, e.g., in block 57*k* in order to provide the digital frequency correction module 30 with the cumulative frequency correction DFRV in the data strobe encoded frequency correction DFR(k), DFR_STB(k) signal.

Based on the number p of clusters $CLT_k$, the digital core 50 sends the corresponding frequency correction value DFR (k) with its strobe signal DFR_STB(k) to the corresponding cluster digital frequency correction module $\mathbf{311}_k$ in the digital frequency correction module 30, through the respective ports of such module 30. These signals are managed by the digital frequency correction module 30, i.e., by each cluster digital frequency correction module $\mathbf{311}_k$, along with the cross-bar 32, which generates the corresponding requests/strobes, the strobe encoded frequency correction request signal DFM_DFR[i], DFM_DFR_STB[i] for the PLL circuits $PL_i$ in the respective cluster transmitters $\mathbf{14}_i$. Each k-th cluster manages a same respective Frequency correction Request DFR_OUT[k], DFR_OUT_STB[k] for all its serial signals, e.g., $T_1, \ldots, T_m$, belonging to that cluster, i.e., for all the data slices of that cluster. As shown the D/S encoded Frequency correction Request DFM_DFR [i], DFM_DFR_STB[i] is received in each transmitter handshake module $HS_i$ in each transmitter $\mathbf{14}_i$, i=1 to m.

The k-th cluster digital frequency correction module $\mathbf{311}_k$ receives acknowledge signals, DS_DFR_ACK[1], . . . , DS_DFR_ACK[m] from each transmitter, namely from each transmitter handshake module $HS_i$, and resynchronize each of them with respect to the local clock DFM_CLK[k], giving resynchronized signals DS_DFR_ACK_RES[i] to the cluster DFM handshake module 3113*k*, which waits that the latest resynchronized signals DS_DFR_ACK_RES[i] is asserted or de-asserted in order to respectively de-assert or newly assert the frequency correction request strobe DFR_OUT_STB[k].

The cluster DFM module 3113*k*, which is on the transmitter side, i.e., SerDes side, is configured to assert the Frequency correction Request strobe DFR_OUT_STB[k] to signal a data present and collectively stable on each line composing the bus of a Frequency correction Request DFR_OUT[k]. When the whole set, in particular bus, of resynchronized acknowledge signals DS_DFR_ACK_RES is asserted, the Frequency correction Request strobe DFR_OUT_STB[k] is de-asserted, thus being free to accept a new Frequency correction Request, namely DFR_LPF_OUT[k] from filter 3112*k*. This is a handshake mechanism on the transmitter side, i.e., between the cluster DFM handshake module 3113*k* and the cluster set of transmitter handshake modules $HS_i$. Also, the cluster DFM handshake module 3113*k* may, as in the exemplary embodiment, signal to the core 50 that a new frequency correction request DFR[k], DFR_STB[k] can be served. In the following it is referred to as an acknowledge signal ACK, such as DS_DFR_ACK[m], which is asserted if it is activated. When a signal is asserted that means it is active, it is doing what its designation indicates, e.g., an acknowledge signal acknowledges, e.g., when logic high, or, for instance, a reset signal RESET is asserted when it is active, which is, e.g., high. Assertion describes the state of both active high and active low signals.

The described handshake mechanism is asynchronous on both sides, cluster DFM module $\mathbf{311}_k$ to transmitters 14 and cluster DFM module 311*k* to the core 50 since each handshake module $HS_i$ in the k-th cluster acknowledges (e.g., sets to high) a response DS_DFR_ACK[i] which is asynchronous with respect to the k-th cluster clock signal DFM_CLK [k] they belong to (moreover the acknowledge signals DS_DFR_ACK[i] in a k-th cluster are also mutually asynchronous, due to pseudo-random modulation of the output transitions of the frequency dividers $FD_i$). In the same way the digital core 50 asynchronously sends a strobe DFR_STB [k] for a new request, meaning that the strobe DFR_STB[k] is raised according to the transitions of a clock which is asynchronous with respect to the k-th cluster clock DFM_CLK[k].

FIG. 1 also shows that a plurality of PLL reference clock signals CSF, CSA, CSC are provided, and the system 11 is configured to select one as the reference clock Tx_REF_CLK(k) for the PLL $PL_i$ of a given cluster. In the same way a multiplexer 312*k* selects, among the plurality of PLL reference clock signals CSF, CSA, CSC, the k-th cluster clock signal DFM_CLK[k] which clocks the digital frequency correction sub-module 311*k* under the control of a selection signal CLK_SEL (k) issued by the system 11.

The reference clock signals CSF, CSC and CSA represents clock reference signals programmable with a same frequency or differently. Since in the product some transmitters 14; or data slices may be placed nearer or farther from the core 50, for similar reasons the reference clock TX_REF_CLK (k) of a cluster can be selected among, in the example a reference clock signal CSC near the core 50, and a reference clock signals CSF far from the Core 50, CSA indicating an auxiliary reference clock signal.

Selected a given reference clock signal, e.g., CSF, for instance for physical design reasons, as the PLL reference clock TX_REF_CLK (k) of a cluster k, this is the PLL reference clock for all the PLL loops $PL_i$ in the cluster.

The DFM 30 and its submodules also receives the same reference clock signals CSF, CSC and CSA and each submodule 311*k* preferably selects, although this is not mandatory, the same clock as per k-th cluster PLL loops $PL_i$ reference clock selection. The selected clock, e.g., CSF, normally referred to as DFM_CLK[k], may be also indicated as DFM_CLT_CLK64 (k), the number 64 indicating 64 Unit Intervals (UI), which means a period of DFM_CLT_CLK64 lasts 64 periods of the serial transmission (e.g., 64 UI; means that if transmission data rate is a 56 GBaud, 1 UI=1/(56E9)=17.857 ps).

Figure 2:
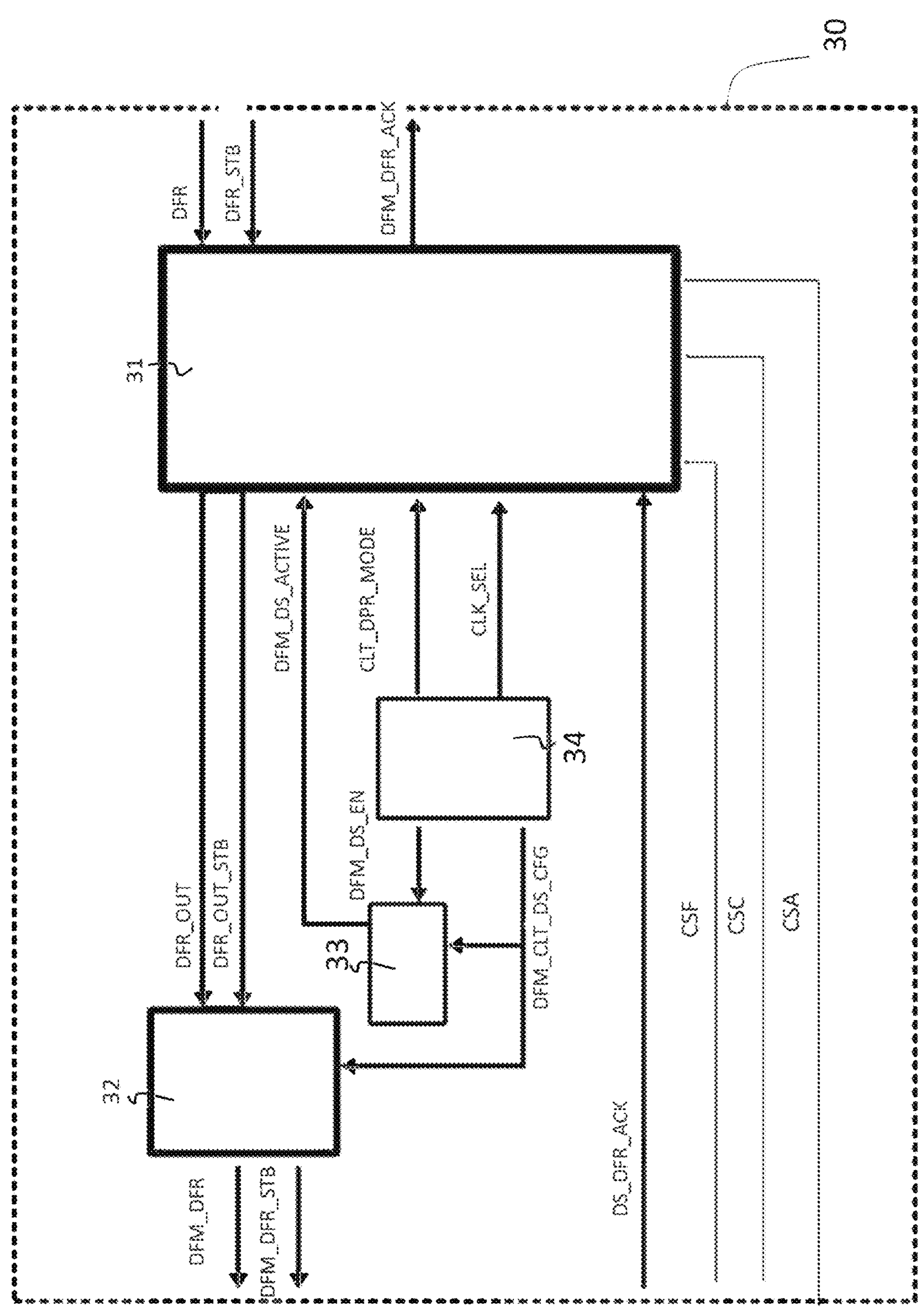
FIG. 2 is schematical representation of a frequency correction module comprised in said system.

FIG. 2 shows a block schematic which details the digital frequency correction module 30, which may contain one or more cluster digital frequency correction modules 311*k*, such as sets of modules 311*k* represented as a whole by a cluster set digital frequency correction module 31, receiving the D/S encoded frequency correction signal DFR[k], DFR_STB[k]. Such D/S encoded frequency correction DFR [k], DFR_STB[k] on the data line contains a frequency correction value DFRV.

Each module 311*k* sends back to the core 50, specifically to the corresponding k-th module 57*k*, the acknowledgement signal DFM_DFR_ACK[k] and receives from the transmitters 14 the acknowledgement signal bus DS_DFR_ACK (each bus line signal being DS_DFR_ACK[i] with i-th index ranging from 1 to the number of data-slices in the k-th cluster).

The digital frequency correction module 30 comprises then a local register map 34, which can be accessed for programming, which outputs to the cross-bar 32 a configuration bus setting DFM_CLT_DS_CFG[i], i.e., a signal which indicates, or sets, to which cluster CLTk each data slice, e.g., 14; (i being the data slice index from 1 to m) belongs. Thus, the local register map 34 sends an Enable setting DS_EN[i], which indicates which data slice, i.e., transmitter $\mathbf{14}_i$, is enabled and which is not to a configuration manager module 33 receiving the setting DFM_CLT_DS_CFG[i] as well. On the basis of such settings the configuration manager module 33 sends an active slice setting DFM_DS_ACT[k], indicating for each k-th cluster which data slice is active, to the cluster set digital frequency correction module 31, which also receives from register map 34 a mode setting CLT_DPR_MODE[k] and the selection setting CLK_SEL[k] to each cluster module $\mathbf{311}_k$. The mode setting CLT_DPR_MODE[k], when active, enables the Delta-Phase mode whose operation disables the repetitions of correction requests DFR_OUT[k] and DFR_OUT_STB [k], therefore implementing a phase-correction operation (the command remains a frequency command, but being not repeated it does not allow the PLLs to reach a new frequency steady-state, i.e., after the phase correction is completed the frequency returns to its nominal value).

When a data-slice belonging to a cluster is not active, the active slice setting DFM_DS_ACT [k] requires not to wait for its acknowledgement signal DS_DFR_ACK[i] in order not to let the handshake operation of the module indefinitely wait for it. This is a per-cluster setting, belonging a data-slice to only one cluster and thus disabled in all the other clusters.

The cluster set digital frequency correction module 31 receives the plurality of PLL reference clock signals CSF, CSC, CSA.

FIG. 3 shows the cluster set digital frequency correction module 31, which manages the set of frequency correction request signal DFR_OUT, DFR_OUT_STB which is arranged in in parallel paths, each referred to D/S encode frequency request signal DFR(k) DFR_STB(k) of a respective cluster k, index k from 1 to p Such cluster set digital frequency correction module 31 comprises the set of digital frequency correction sub-modules, from $\mathbf{311}_1$ to $\mathbf{311}_p$, p being the total number of clusters.

Each k-th digital frequency correction sub-module $\mathbf{311}_k$, receives D/S encoded frequency request signal DFR(k) DFR_STB(k) of the respective cluster k, which are the respective portions for the k-th cluster of the frequency request signal DFR and of the corresponding delta frequency request strobe signal DFR_STB. Each digital frequency correction sub-module $\mathbf{311}_k$ is associated to the respective multiplexer $\mathbf{312}_k$ which selects one clock among the plurality of clock signals CSF, CSA, CSC, that is the k-th cluster clock signal DFM_CLK[k] which clocks the digital frequency correction sub-module $\mathbf{311}_k$, under the control of the selection signal CLK_SEL (k).

As shown, the k-th digital frequency correction module Cluster $\mathbf{311}_k$ receives the respective active slice signal DFM_DS_ACT (k) and the respective mode signal CLT_DPR_MODE (k) in addition to the respective selection signal CLK_SEL (k).

Then, the k-th digital frequency correction module Cluster $\mathbf{311}_k$ outputs the output signal DFR_OUT (k) along with the corresponding output signal strobe DFR_OUT_STB (k) corresponding to the k-th cluster to the cross-bar 32.

The mode signal CLT_DPR_MODE (k) signals the operation mode of the interface, i.e., if the PLL circuits $PL_i$ have to update the phase instead of the frequency, i.e., Delta Phase whose operation disables the repetitions of correction requests DFR_OUT[k] and DFR_OUT_STB[k], also later indicated as One-Shot (as opposed to Delta Frequency, i.e., with repetitions of correction requests, or Continuous mode)

Each k-th cluster digital frequency correction module $\mathbf{311}_k$ sends also a respective acknowledgment per cluster signal DFM_DFR_ACK[k], which represents the signaling to the digital core 50 of an acknowledgment for a set of data slice of a specific cluster, i.e., the k-th cluster, after receiving all the acknowledge signals DS_DFR_ACK[1] . . . . DS_DFR_ACK[m] from the transmitters of the k-th cluster, e.g., $\mathbf{14}_1, \ldots, \mathbf{14}_m$. As mentioned, with respect to the handshake on the core side, issuing the acknowledgment signal DFM_DFR_ACK[k] may be optional, such signal may be used by the core 50 to implement a watchdog. The acknowledgment signal DFM_DFR_ACK[k] in fact acknowledges when the latest acknowledge signal DS_DFR_ACK[i] from the cluster has acknowledged.

Figure 4:
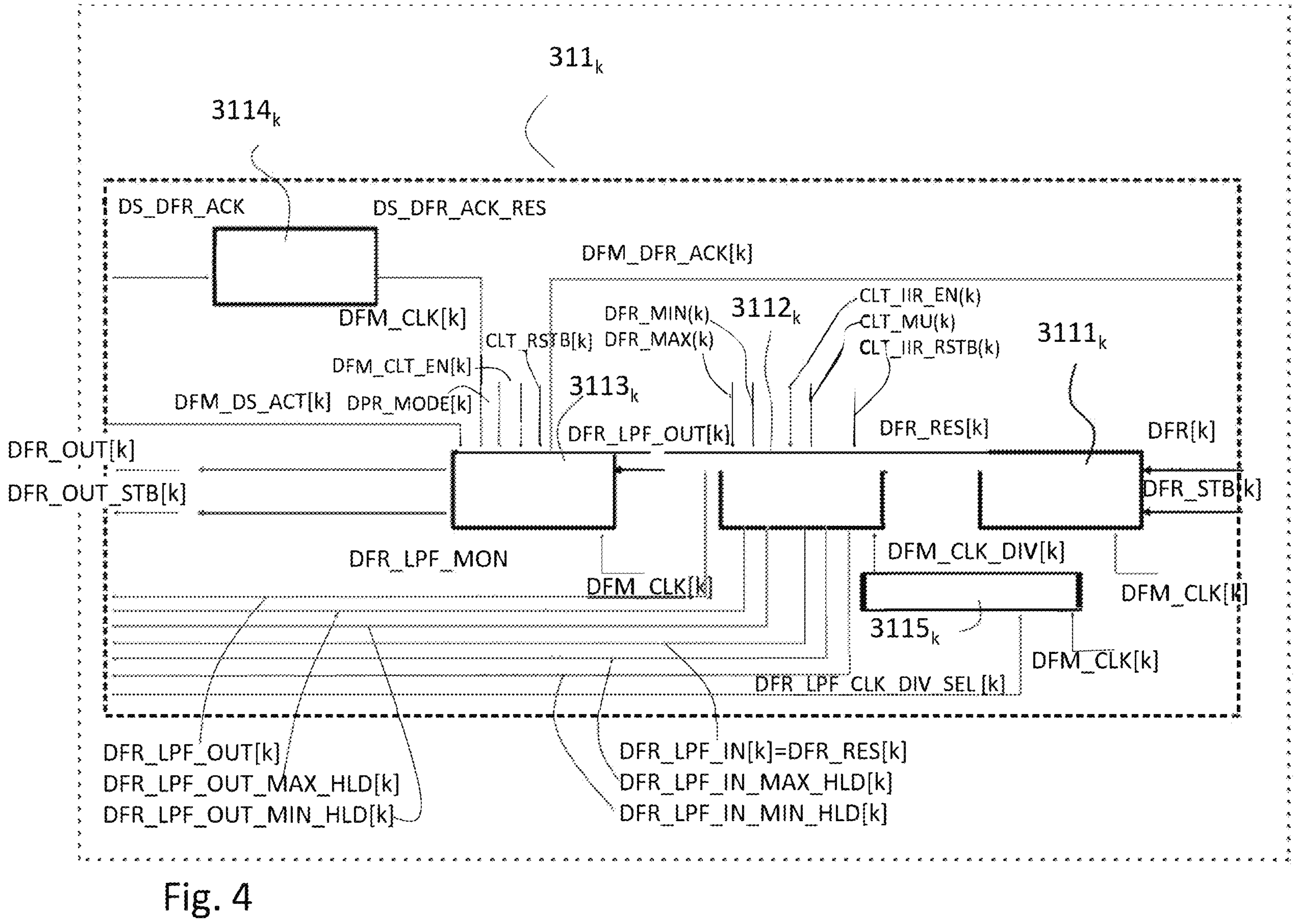
FIG. 4 is schematical representation of one of the cluster frequency correction module per cluster.

FIG. 4 shows in the detail the k-th k-digital frequency correction sub-module $\mathbf{311}_k$, which is used to process a frequency correction, i.e., a frequency update request, for a given group, i.e., cluster, of transmitters, e.g., $\mathbf{14}_1, \ldots, \mathbf{14}_m$.

Such k-th digital frequency correction sub-module $\mathbf{311}_k$ comprises a core DFR resynchronizer $\mathbf{3111}_k$, which receives the respective per cluster frequency correction signal DFR (k) and corresponding strobe signal DFR_STB(k) and specifically resynchronizes the strobe signal DFR_STB(k) with the selected k-th cluster clock signal DFM_CLK[k], which also the k-th digital frequency correction sub-module $\mathbf{311}_k$ receives, outputting a resynchronized signal DFR_RES(k), which is brought as input to a low pass filter $\mathbf{3112}_k$, in the example a IIR (Infinite Impulse Response) filter. Such low pass filter $\mathbf{3112}_k$ receives a set of filter parameters which may include maximum value DFR_MAX(k), minimum value DFR_MIN(k), time-constant related value CLT_MU(k), IIR enable CLT_IIR_EN(k) and IIR reset bar CLT_IIR_RSTB (k), reset bar indicating negated reset, meaning the reset is active, it resets, when the reset bar CLT_IIR_RSTB(k) is at its low level. The low pass filter 3112$_k$ in addition to a set of monitor signals DFR_LPF_MON, outputs a filtered signal DFR_LPF_OUT[K] to a handshake block 3113$_k$. The set of monitor signals DFR_LPF_MON includes output-related measurements, e.g., maximum of the output signal DFR_LPF_OUT_MAX_HLD[k], minimum of the output signal DFR_LPF_OUT_MIN_HLD[k] and the output signal itself DFR_LPF_OUT[k], and input-related measurements, e.g., maximum of the input signal DFR_LPF_IN_MAX_HLD[k], minimum of the input signal DFR_LPF_IN_MIN_HLD[k] and the input signal itself DFR_LPF_IN[k]=DFR_RES[k].

The low pass filter 3112$_k$ is clocked by a divided k-th cluster clock signal DFM_CLK_DIV[k] obtained through a divider block 3115$_k$ which receives the k-th cluster clock signal DFM_CLK[k] and divides it by a value set by a selection signal DFR_LPF_CLK_DIV_SEL[k], setting the sampling frequency of the IIR digital filter embodied by the low pass filter 3112$_k$. The low pass filter 3112$_k$ is used to filter undesired noise on the filter input.

The handshake block 3113$_k$ receives the resynchronized acknowledgment signals DS_DFR_ACK_RES[i], which are the data-slice acknowledgement signals DS_DFR_ACK[i] resynchronized with the selected k-th cluster clock signal DFM_CLK[k] in a data slice acknowledge per cluster resynchronization module 3114$_k$. Also, the handshake block 3113$_k$ receives the active slice signal DFM_DS_ACT[k].

The handshake block 3113$_k$ receives also setting signal as the mode select DPR_MODE [k] (internal signal name for CLT_DPR_MODE[k]), cluster enable DFM_CLT_EN[k] and cluster bar reset CLT_RSTB[k].

The handshake block 3113$_k$ then outputs the output signal DFR_OUT[k] for the cluster k along with an output signal strobe DFR_OUT_STB[k] for the cluster k, DFR_OUT[k] representing a common request command for the data slices of the cluster and DFR_OUT_STB[k] the strobe signal that qualifies the command. As said, a configurable de-muxing matrix, crossbar 32 is available into the DFM 30.

As mentioned, according to a relevant aspect of the solution, the DFM 30 may reiterate the command depending on the CLT DPR_MODE signal setting.

The DFM handshake block 3113$_k$ can reiterate the command, i.e., repeat asserting the strobe signal DFR_OUT_STB[k] when all the active acknowledge DS_DFR_ACK signals of the corresponding k-th cluster get de-asserted (toggle to 0). The repeated de-assertion of all the active acknowledge signals DS_DFR_ACK[i] indicates to the DFM 30 to operate therefore the repetition of the frequency correction request strobe DFR_OUT_STB[k] assertion, while on the digital core side the assertion of all the active acknowledge signals DS_DFR_ACK[i] tells the DFM 30 to operate the acknowledgment DFM_DFR_ACK[k] assertion, which however is specified to happen only once per frequency correction request strobe DFR_STB[k] assertion (i.e., regardless of the repetition of the assertion of all the active acknowledge signals DS_DFR_ACK[i]).

Each data acknowledge DS_DFR_ACK[i] signal is kept high for a given number of clock cycles CY, which, as mentioned is programmable in the Data-Slice Hand-Shake block HS$_i$. This number represents the duration of the frequency correction command at the Sigma-Delta SM$_i$ input in terms of the PLL PL$_i$ divider FD$_i$ output clock cycles count. It is noted that the frequency correction request DFM_DFR[i], DFM_DFR_STB[i] for the i-th transmitter is repeated, however what is actually held, for a number CY cycles, is the sigma delta modulator SM; handshake block output that interfaces a summing node (not shown) internally to the sigma delta modulator SM; where the held value is added to the nominal ratio ND, i.e., such summing node is managed by the sigma delta modulator SM$_i$ to give the sigma delta modulator SM$_i$ output as average value equal to ND$_i$+DFRV$_i$. The held value has a duration equal to CY cycles for each repetition of the frequency correction request DFM_DFR[i], DFM_DFR_STB[i].

The reiteration of the request, e.g., D/S encoded signal DFR_OUT[k], DFR_OUT_STB[k] at the DFM handshake block 3113$_k$, before any new request, e.g., in the signal DFR[k], DFR_STB[k] inputting the DFM handshake block 3113$_k$, as filtered signal DFR_LPF_OUT[k], implies that the effective frequency correction is slightly reduced by the duty-cycle of the reiterated command waveform at the sigma delta modulator SM; handshake block output to the sigma delta modulator SM; internal summing node input, e.g., duty-cycle ~99% due to the number CY of cycles being much higher than the gap cycles inserted between repetitions, while the jitter increase is negligible. The repetition of the frequency correction request DFM_DFR[i], DFM_DFR_STB[i] for each i-th transmitter, and in the same way of the k-th cluster Frequency correction Request DFR_OUT[k], DFR_OUT_STB[k] outputted by module 311$k$, are not characterized by the holding of the delta-frequency request value for CY cycles, but just for the few cycles that are needed from the strobe DFR_OUT_STB[k] assertion, and the strobe DFM_DFR_STB[i] sending to the i-th data-slice, to the de-asserting both the strobes upon the reception of asserted resynchronized signals DS_DFR_ACK_RES[i].

Figure 5:
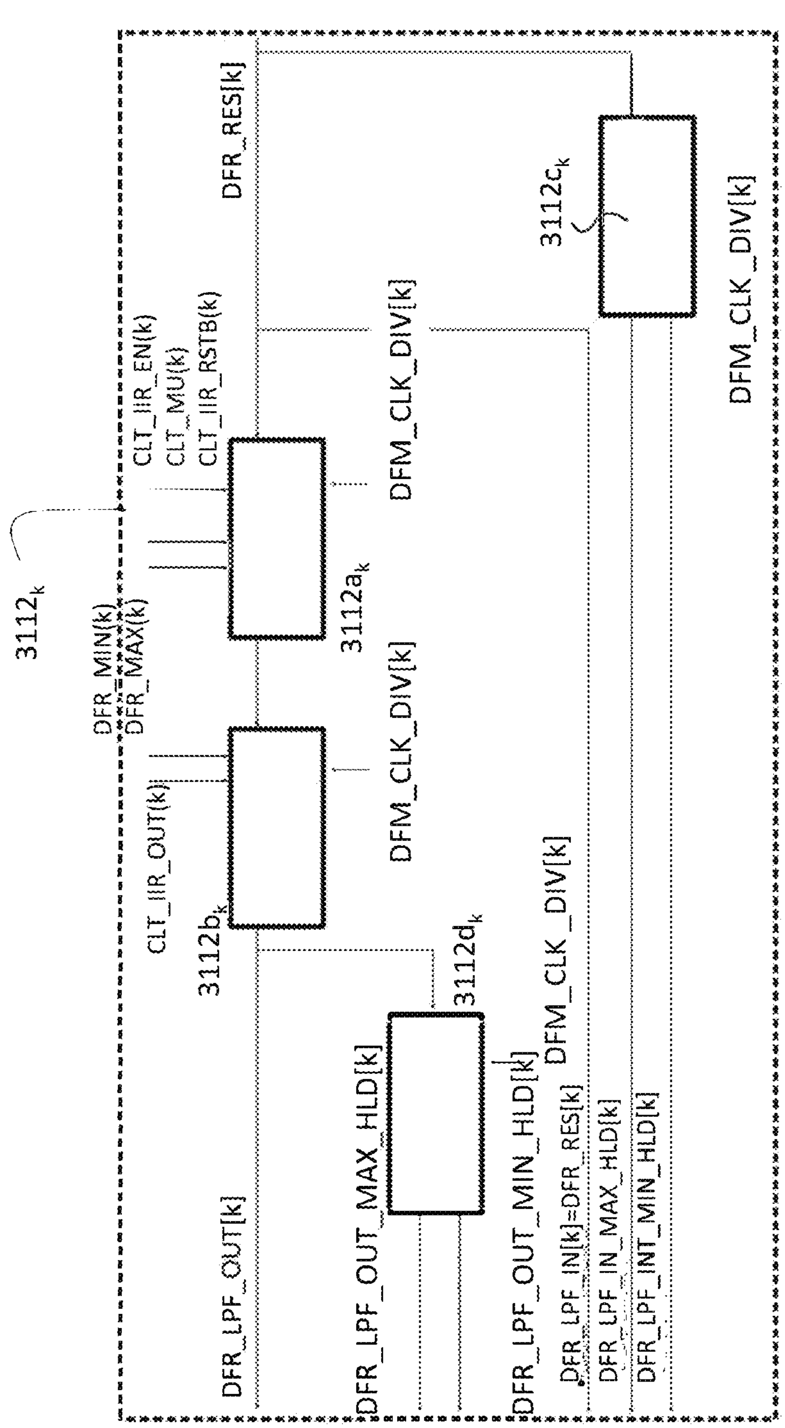
FIG. 5 is schematical representation of a filter comprises in one such submodule.

FIG. 5 shows details for the low pass filter 3112$_k$ which is configured to filter high-rate frequency update requests for a given group of data paths. Due to the correctness of the expected request rate with respect to the specified typical parameters of the filter, the effect of filtering shall actually be to smooth any undesired noise on the filter input.

Such low pass filter 3112$_k$ basically comprises a IIR filter 3112$a_k$ receiving the input, i.e., resynchronized signal DFR_RES(k) and which output is supplied to an output saturation block 3112$b_k$, which receives the maximum and minimum value of the per cluster frequency request signal DFR(k) as input settings, to eventually set limits to the dynamic of the output signal, i.e., the filtered signal DFR_LPF_OUT[k]. The low pass filter 3112$_k$ comprises an input min max calculation block 3112$c_k$ and an output min max calculation block 3112$d_k$, which receive as input the resynchronized signal DFR-RES(k) and the filtered signal DFR_LPF_OUT[k] respectively. The minimum and maximum values calculated by these blocks are then output by the low pass filter 3112$_k$ in the set of monitor signals DFR_LPF_MON, as indicated with reference to FIG. 4, along with the input, resynchronized signal DFR-RES(k), and the output, filtered signal DFR_LPF_OUT[k].

All the blocks of the low pass filter 3112$_k$ are clocked by the divided k-th cluster clock signal DFM_CLK_DIV[k].

Figure 6:
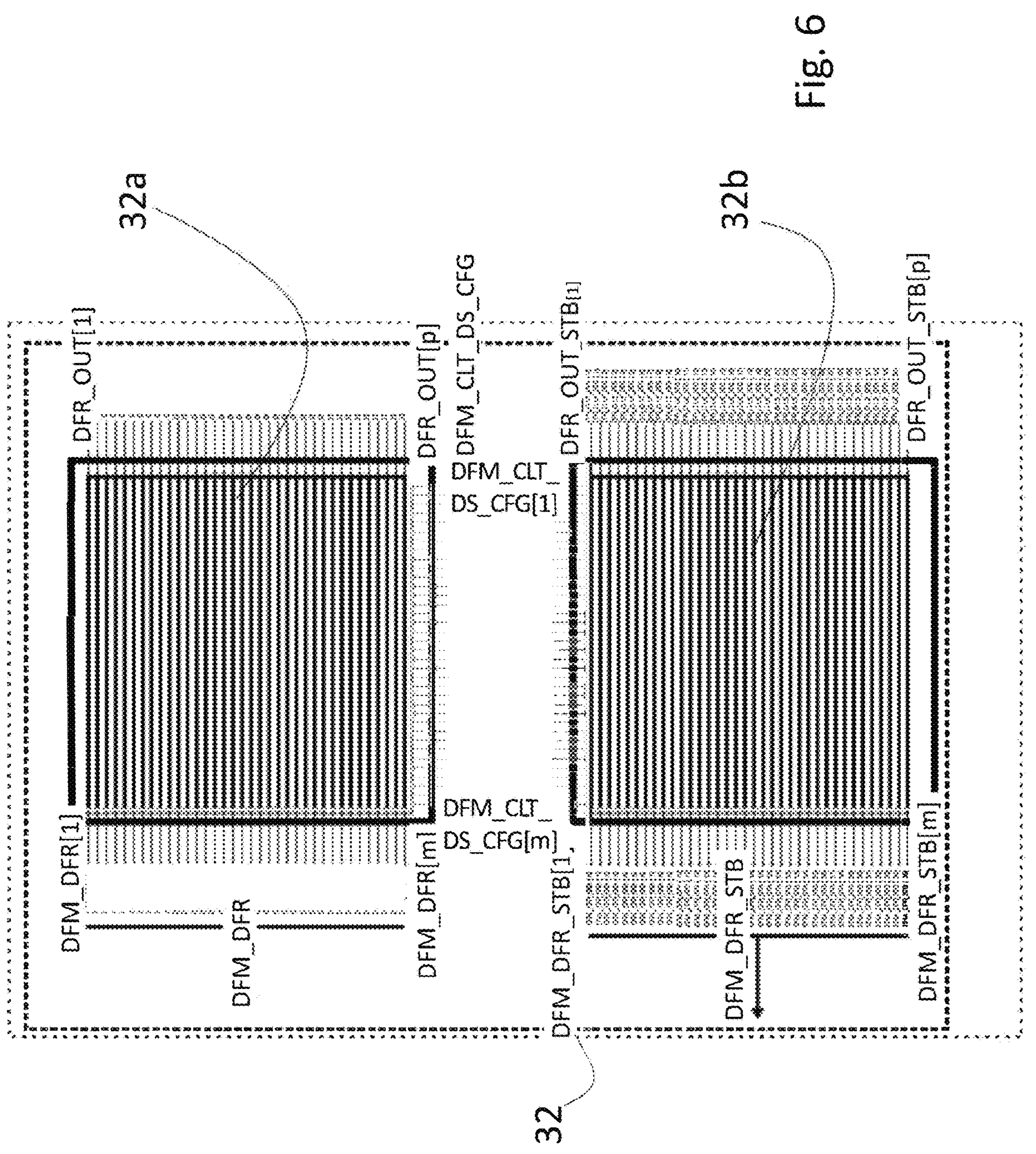
FIG. 6 is a schematical representation of a cross bar comprised in frequency correction module.

FIG. 6 shows the crossbar 32, comprising a first crossbar 32$a$ where m=36 and p=36, so the input are DFR_OUT[1] to DFR_OUT[p], one for each cluster, and the output DFM_DFR[1] to DFM_DFR[m], one for each data slice.

The configuration bus signal DFM_CLT_DS_CFG is DFM_CLT_DS_CFG[1] to DFM_CLT_DS_CFG[m].

All the requests processed in parallel are served to the data-path depending on their grouping.

Each frequency correction request DFR_OUT[k] is in fact coupled to all the data-slices 14$i$ that belong to the k-th cluster. This is achieved by controlling m output multiplexers through each configuration bus setting DFM_CLT_DS_CFG[i] value.

Then, a second cross-bar structure 32*b* is also available for the strobe bus DFR_OUT_STB[k] with k from 1 to p, which have the purpose to flag that new requests, independently from 1 to p, i.e., frequency corrections, are available, receiving as input in parallel DFR_OUT_STB[1] to DFR_OUT_STB[p] and outputting DFM_DFR_STB[1] to DFM_DFR_STB[m].

The data-path service, is configurable by configuration bus setting DFM_CLT_DS_CFG and by the configuration manager 33, which respectively set: which data paths to be connected to the assigned processed request DFR_OUT (it depends on which data paths belong to a group or cluster) by the crossbar 32 (comprising the strobe signals); this information is given in the DFM_CLT_DS_CFG[i] setting, one for each data-slice, and it is also an input for the configuration manager 33; and which data paths to be enabled in each group request handling block (in order to disregard the acknowledge signals coming from the data paths that not belong to the group or cluster). This information is given in the active slice signal, DFM_DS_ACT[k], one for each cluster.

Thus, the configuration manager 33 is configured to indicate the signal DFM_DS_ACT[k], indicating for each cluster which transmitter is active on the basis of a setting signal DFM_CLT_DS_CFG which indicates, which cluster each transmitter, or data-slice, 14*i*, belongs to, and on the basis of a setting signal DFM_DS_EN indicating which transmitter is enabled.

Figure 7:
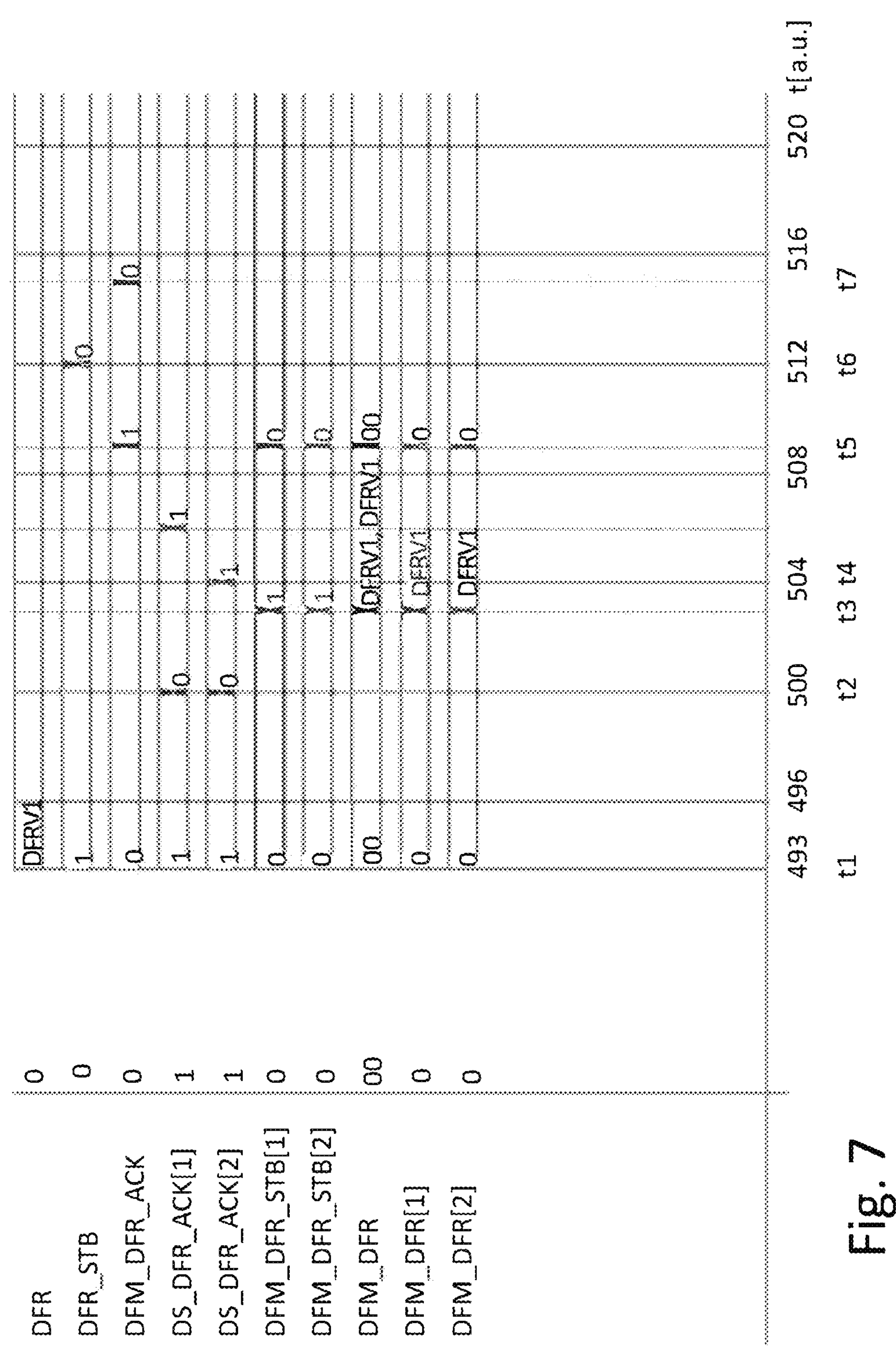
FIG. 7 is a time diagram of signals of the frequency correction module.

FIG. 7 is a time diagram showing a multi clock domain hand-shake protocol example, i.e., the transitions of some of the signals described so far, according to the handshake protocol implemented by the digital frequency correction module 30. The time t is in arbitrary units. It refers to an example with one cluster comprising two data slices, i.e., two transmitters $T_1$ and $T_2$.

The signals in order from top to bottom are the frequency correction DFR signal along with its strobe signal DFR_STB from the core 50 to the module 30, the acknowledgement signal DFM_DFR_ACK sent back from the cluster set digital frequency correction module 31 to the core 50, the acknowledgement signals DS_DFR_ACK[1] and DS_DFR_ACK[2] for each data slice, the frequency correction request strobe signal DFM_DFR_STB[1] and DFM_DFR_STB[2] for each data slice, the frequency corrections DFM_DFR[1] and DFM_DFR[2]. The column of values near the labels indicates, their initial o initialization logic value. In the figure the initialization value for DFR_STB is 0, which is different from 1 where the zoomed diagram starts.

The frequency correction DFR signal sets a value, e.g., correction value DFRV1 ($DFRV_k$, k=1, only one cluster in the example), at a time before a first observed time t1=493 a.u. circa, i.e., the time <493 a.u. the frequency correction is commanded by the digital core 50, while the frequency correction strobe signal DFR_STB is set at 1, i.e., asserted. At a second time t2=500, the two acknowledgment signals DS_DFR_ACK[1] and DS_DFR_ACK[2] are de-asserted (the synchronicity in the figure may not correspond to a real case, and not relevant at this point of the timeline). They were preinitialized as asserted signals. Their de-assertion is driving the assertion of the strobe signals DFM_DFR_STB[1] and DFM_DFR_STB[2] at a third time t3=503 a.u., when the frequency correction DFM_DFR is sent to both the data slices, by sending the correction value DFRV1 in the requests DFM_DFR[1] and DFM_DFR[2] for data slices i=1 and 2, More generally, the latest de-assertion between acknowledgment signals DS_DFR_ACK[1] and DS_DFR_ACK[2] is driving the assertion of the frequency correction request strobe signals DFM_DFR_STB[1] and DFM_DFR_STB[2] for each data slice. Such assertions are always synchronous to each other and to the initial transition of the correction value DFRV1 holding in requests DFM_DFR[1] and DFM_DFR[2], because these transition share all the same cluster clock DFM_CLK[1]. Thus, the corresponding transmitter handshake modules $HS_1$ and $HS_2$ have to react, having their sigma delta converter $SM_1$ and $SM_2$ modified inputs to add the correction value DFRV1 to the divider average nominal value ND of the dividers $FD_1$ and $FD_2$ of their PLL loop $PL_1$ and $PL_2$. Then at two subsequent (due to asynchronous clocks) times t3 (504 a.u.) and t4 (506 a.u.) are issued the acknowledgement signals DS_DFR_ACK[1] and DS_DFR_ACK[2] for each data slice, then at a later (due to latency in the acknowledgement signals DS_DFR_ACK resynchronization at block $\mathbf{3114}_k$ and due to the asynchronous cluster clock DFM_CLK[1] with respect to transitions of acknowledgement signals DS_DFR_ACK) time t5 is asserted the acknowledgement signal DFM_DFR_ACK to the core 50, i.e., set to logic one, so that the digital core 50 can send a new frequency correction, if a new phase error PE is detected. In particular, if the acknowledgment DFM_DFR_ACK to the core is asserted the Core 50 can de-assert its own frequency correction request strobe DFR_STB, i.e., from the core 50 to the DFM 30, to be ready to send a new request and, as a stronger requirement, may send a new request by raising its own frequency correction request strobe DFR_STB after acknowledgment DFM_DFR_ACK is de-asserted. The de-assertion of the frequency correction request strobe DFR_STB is driving the de-assertion of the acknowledgment to the core DFM_DFR_ACK. At time t5 (509 a.u.) the frequency correction signals DFM_DFR[1] and DFM_DFR[2] and the frequency correction request strobe signal DFM_DFR_STB[1] and DFM_DFR_STB[2] are de-asserted, i.e., set back to logic 0 (this meaning that the DFM handshake module 3113*k* has de-asserted its output signals DFR_OUT[k], DFR_OUT_STB[k]. These de-assertions can be synchronous with the assertion of the acknowledgment to the core DFM_DFR_ACK because of the sharing of the same cluster clock DFM_CLK[1] in the $\mathbf{311}_k$ block, i.e., same transitions. At later times also the strobe signal DFR_STB (t6=512 a.u.) is set at 0, then finally (t7=515 a.u.) the acknowledgement signal DFM_DFR_ACK is set back to logic zero. The data slice or transmitters $\mathbf{14}_1$ and $\mathbf{14}_2$ maintain their acknowledgement signals DS_DFR_ACK[1] and DS_DFR_ACK[2] for the programmed number of cycles CY. Then their latest de-assertion is driving the assertion of the strobes DFM_DFR_STB_1 and DFM_DFR_STB_2 even without a correction value DFRV, i.e., DFRV=0 (DFRV1 in the figure), therefore reiterating the assertion/de-assertion protocol between the data-slices and the module 30 (reiteration enabled for DPR_MODE=0).

Figure 8:
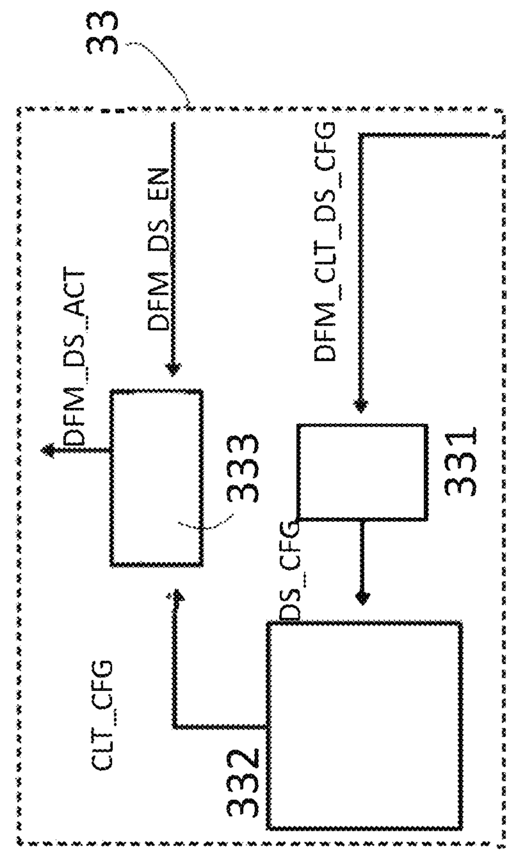
FIG. 8 is schematical representation of a configuration manager module comprised in the frequency correction module.

The configuration manager 33, shown in FIG. 8, is a logic block which operates to output such an active slice setting DFM_DS_ACT on the basis of the configuration bus setting DFM_CLT_DS_CFG, converted by a one hot converter (HC) 331 (see FIG. 8) in a converted matrix DS_CFG and passed to a configure block 332 which generates a cluster configuration setting CLT_CFG, which is put in an AND in logic block 333 with the Data Slice Enable setting DFM_DS_EN from the map register 34 which indicate which data slices DS are enabled.

The purpose of the configuration manager 33 is the conversion of the format of input numbers to make such per-data-slice numbers compatible with the per-cluster AND operation. Thus, the conversion is done first at the one-hot converter 331 from unsigned input numbers to one-hot representation output numbers, one number for each data-slice; then a m×p matrix DS_CFG (row by row the matrix is built with m one-hot numbers, one for each data-slice. Each number has p bits width) is passed through the block 332 which just reads the matrix DS_CFG column by column, issuing p numbers with m bits width. Each per-cluster AND (there are p AND operators) operates across m bits width buses, i.e., for cluster k it performs the AND between the CLT_CFG[k] first bit with the DFM_DS_EN first bit, and so on for the other bits up to the m-th bit.

Regarding the handshake procedure implemented by the DFR 30, the digital frequency correction module 30 by default operates in a so-called "Continuous Mode" option (DPR_MODE[k]=0, for each k-index ranging from 1 to p, in order to repeatedly strobe the request, e.g., DFR_OUT[k], DFR_OUT_STB[k], for each cluster, to the data-slices **14*i*, therefore handling the requested frequency updates. This repetition, for any cluster, lasts until a new frequency update request, DFR [k], DFR_STB[k] is strobed from the Core 50 to the DFM 30. Since the repetition of such request, e.g., DFR_OUT[k], DFR_OUT_STB[k] from the digital frequency correction module 30 to the data-slices implies the repetition of the data-slice acknowledgements, e.g., DS_ACK[i], as well, the first repetition only is monitored to detect the latest acknowledgment among the data-slices acknowledgments DS_ACK[i], and send it to the digital Core 50 as acknowledgement DFM_DFR_ACK[k]. Alternatively, when DPR_MODE[k]=1 for each k-index, the digital frequency correction module 30 operates in the "One-Shot" mode option, meaning that it does not repeat the requests DFR_OUT[k], DFR_OUT_STB[k] to the data-slices $\mathbf{14}_i$, therefore handling the phase update associated to the DFR[k] level integration over the number of data-slices clock cycles CY, which is programmed in the data-slices register map 34**. Completely independent DPR_MODE[k] settings allow for maximum flexibility.

It is underlined that by assigning a same number of data-slices clock cycles CY, to all the data slices or transmitters in a cluster, it is ensured that the phase accumulation for each transmitter or data slice of a same cluster is not arbitrary, but depending from the value of the frequency correction DFRV or update and its time length, i.e., the number of cycle CY. Otherwise, since only one PLL divided clock, e.g., $TC_m$, is extracted for each cluster, and it is representative only of one transmitter, i.e., $\mathbf{14}_m$, among the data slices in the cluster, and since from the phase error PE detected by the phase-detector **55*k* it is commanded the frequency correction DFR[k] updating all the frequency of all the data slices in that cluster, there is the risk that the other data slices not in closed loop with the FIFO 13 write clock (there is only one phase-detector 55*k* in fact) will accumulate an arbitrary phase shift during the application of the command, because of the independence between the sigma-delta modulator clocks. The accumulation of these arbitrary phase shifts can result, over a longer term, in phase drift for data slices in the cluster that are not in closed loop through the phase-detector 55*k*. Even for a closed loop available for each data-slice with respect to the unique FIFO 13 write clock, and with the FIFO 13 read clock corresponding to one respective selected PLL low frequency clock $TC_m$ only, as long as a frequency-type correction is concerned, the arbitrary phase shift will remain possible without the number CY cycles counting feature, due to the sigma-delta modulator independently, i.e., asynchronously, clocking the commands. Reading data from the FIFO 13 with one respective selected PLL low frequency clock $TC_m$ only may then cause misalignment between buses $B_i$ with respect to transmitter $\mathbf{14}_i$, with i ranging from 1 to m−1 (the value m of index i excluded because aligned to read the FIFO 13**).

The transmitter handshake module $HS_i$ thus is configured in one mode to guarantee the application of the frequency correction, DFRV, i.e., ND+DFRV at the sigma delta modulator $SM_i$ input, for a given number of cycles CY equal for all the transmitters or data slices of a same cluster. Further, the DFM 30 is reiterating the same request DFR_OUT[k] with the same correction value DERVk until a new error PE is detected by the detector **55*k*. Up then, the handshake procedure between the sigma delta modulators in the same cluster and the DFM 30**, namely the relevant cluster DFM module $\mathbf{311}_k$, ensures that reiteration of that correction value is applied only when the sigma delta modulators have all completed the number of cycles CY. This could not be possible, without hand-shake, because of the independence of the transitions of the clock of the different sigma delta modulators in cluster.

Under this view, it is underlined that the handshake does not require a same choice among reference clocks CSC, CSA, CSF for the k-th cluster and the cluster DFM **311*k*, as indeed it ensures rather that, even there are different clock domain, the communication operates properly. Choosing the same reference clock for both the k-th cluster and the cluster DFM 311*k*** however minimizes the differences.

Despite such minimization, the clock domains are not reduced to one, domain of the cluster k, since each Sigma Delta modulator has its own clock domain. This being the reason why the number of cycles CY is counted. Although the clock of each sigma-delta modulator is equal as an average period to the period of the PLL reference clock Tx_REF_CLK, e.g., k, the two observed periods without averaging operations are different due to the modulation of the sigma-delta clock, an aspect that also underlies the arbitrary phase accumulation that each data slice would experiment if not controlled in the manner described above.

Therefore, the DFM 30 operates asynchronously on both sides and for each cluster, i.e., for each cluster on the data-slices side there are the sigma modulator $SM_i$ clock domains and on the core 50 side there is the clock domain used to assert/de-assert the frequency correction request strobe strobe DFR_STB[k]; both sides are asynchronous with respect to the cluster clock DFM_CLK[k].

Thus, summarizing, based on the above, the solution here described refers to an electronic digital system, e.g., 11, for instance a System On Chip comprising a digital core, e.g., 50 and a Serializer Deserializer module, e.g., 60. The digital core of the system may substantially correspond to the system 11 without the SerDes portion.

Such digital core, e.g., 50 comprises at least a FIFO architecture device, e.g., 13, in particular a FIFO memory, written with a write clock, e.g., the recovery clock DRC and configured to transmit parallel data, read from said FIFO architecture device, e.g., 13 with a read clock, e.g., one of the PLL low frequency divided clocks $TC_m$, from said FIFO architecture device, e.g., 13 on a set of buses, e.g., $B_1$, . . . , $B_m$ to said Serializer Deserializer module, e.g., 60. As mentioned the Serializer Module 60 can also be seen as comprising a set of SerDes, outputting a different number of serial signals, as also a single serializing chain sending a single serial signal can embody the Serializer Deserializer module, e.g., 60, i.e., the set comprises only one element. In general, for m aggregated data bus there will be m SerDes in the module 60.

The Serializer Deserializer module, e.g., 60 is thus configured to transmit the data read from said FIFO architecture device, e.g., 13 on a set of buses, e.g., $B_1, \ldots, B_m$ as a corresponding set of serial signals, e.g., $T_1, \ldots, T_m$ transmitted by a respective set of transmitters, e.g., $\mathbf{14}_1, \ldots, \mathbf{14}_m$, the set of serial signals, e.g., $T_1, \ldots, T_m$ and the corresponding set of transmitters, e.g., $\mathbf{14}_1, \ldots, \mathbf{14}_m$ being logically grouped according to one or more group or clusters, e.g., $CLT_k$, in particular corresponding to one or more group of buses, e.g., $B_1, \ldots, B_m$. Different choices of grouping can be performed, the SerDes can for instance comprise only one cluster and also only one transmitter or SerDes. It is to mention that, in case of more clusters, a transmitter can belong to one cluster only, which is the reason behind the configuration one-hot notation.

The set of transmitters, e.g., $\mathbf{14}_1, \ldots, \mathbf{14}_m$ comprises respective independent PLL circuits, e.g., $PL_1, \ldots, PL_m$, issuing respective PLL clock signals, and the corresponding externally low frequency, in particular divided, clocks, e.g., $TC_1, \ldots, TC_m$, using as reference a cluster transmitter reference clock, e.g., Tx_Ref_Clock common to said transmitters, e.g., $\mathbf{14}_1, \ldots, \mathbf{14}_m$, e.g., transmitter of a same cluster, controlling a frequency of operation, in particular serialization, e.g., the frequency of the serializer $PS_i$, of said transmitters, e.g., $\mathbf{14}_1, \ldots, \mathbf{14}_m$.

According to the solution here described, such system, e.g., 11 comprises:

- a digital frequency correction module, indicated with 30 in the exemplary embodiment, configured to supply to each independent PLL circuit, e.g., $PL_1, \ldots, PL_m$ a data strobe encoded frequency correction signal, e.g., DFM_DFR, DFM_DFR_STB specifying a command for a frequency correction, e.g., DFR obtained, e.g., 57*k* from a detected phase error, e.g., PE, in particular detected by an error detection module, e.g., 55*k* comprised in the digital core, e.g., 50, between the write clock, e.g., DRC and the read clock, e.g., $TC_m$, said read clock corresponding to one of such PLL low frequency, in particular, divided clock signals, e.g., $TC_1, \ldots, TC_m$;
- the digital frequency correction module 30 comprising one or more cluster digital frequency correction sub-modules, e.g., $\mathbf{311}_k$, corresponding to a respective cluster, e.g., $CLT_k$, clocked by a respective cluster clock signal, e.g., DFM_CLK[k], configured to receive and process a respective data strobe encoded cluster frequency correction, e.g., receiving and processing requests DFR[k], DFR_STB[k] from the core 50 and issuing requests DFR_OUT[k], DFR_OUT_STB[k] to the cluster, while after a cross-bar 32, the DFM_DFR [i], DFM_DFR_STB[i] are issued for each data-slice, each of the transmitters, e.g., $\mathbf{14}_1, \ldots, \mathbf{14}_m$ being configured to assert respective acknowledge signals, e.g., DS_DFR_ACK_i when receiving said data strobe encoded cluster frequency correction, e.g., DFM_DFR [k], DFM_DFR_STB[k] signal specifying a command for a frequency correction, e.g., DFR. As described, this is performed by the sigma delta modulators $SM_i$, in particular comprising transmitter handshake modules $HS_i$ to that purpose.

It its turn, each cluster digital frequency correction sub-module, e.g., $\mathbf{311}_k$ comprises a handshake module, e.g., $\mathbf{3113}_k$ receiving a set, in particular a bus, of said acknowledge signals, e.g., DS_DFR_ACK by the respective transmitters, e.g., $\mathbf{14}_1, \ldots, \mathbf{14}_m$, (in particular, all transmitters, even the ones not in the cluster which are disregarded by means of the active slice signal DFM_DS_ACT[k] settings), which are resynchronized with the cluster clock DFM_CLK [k], i.e., a resynchronized set of acknowledge signal, e.g., resynchronized signals DS_DFR_ACK_RES[i], such handshake module, e.g., $\mathbf{3113}_k$ being configured to issue said data strobe encoded frequency correction signal, e.g., DFR_OUT [k], DFR_OUT_STB[k] as asserted to command a frequency correction of the respective cluster transmitters, e.g., $\mathbf{14}_1, \ldots, \mathbf{14}_m$ upon receival of a resynchronized set of de-asserted resynchronized acknowledge signals, e.g., DS_DFR_ACK_RES[i], from all the transmitters indicated as active to the handshake module $\mathbf{3113}_k$, in particular by the signal DFM_DS_ACT, e.g., $\mathbf{14}_1, \ldots, \mathbf{14}_m$ of the cluster, e.g., $CLT_k$-in other words each cluster digital frequency correction sub-modules such as $\mathbf{311}_k$ receives the full set of signals DS_DFR_ACK such that the setting of the signal DFM_DS_ACT[k] relative to the k-th cluster allows to take into account a subset only of the set of signals DS_DFR_ACK, specific for the k-th cluster $CLT_k$-said transmitters $\mathbf{14}_1, \ldots, \mathbf{14}_m$, or data slices, being configured to de-assert said acknowledge signals, i.e., acknowledge signals DS_DFR_ACK issued by the transmitters and received resynchronized as DS_DFR_ACK_RES[i] in the handshake module, e.g., $\mathbf{3113}_k$, upon completion of a number, in particular CY, cycles of a frequency correction, e.g., ND+DFR, in particular ND+$DFRV_k$, on the frequency, e.g., $HF_1, \ldots, HF_m$ of all the independent PLL circuits $PL_1, \ldots, PL_m$ of the corresponding cluster, e.g., $CLT_k$.

Also, the transmitters, e.g., $\mathbf{14}_1, \ldots, \mathbf{14}_m$ of a cluster are programmable with a same number of cycles, e.g., CY and they are configured to maintain the respective acknowledge signals, e.g., DS_DFR_ACK from all the enabled transmitters, e.g., $\mathbf{14}_1, \ldots, \mathbf{14}_m$ asserted for a time duration corresponding to said number of cycles, e.g., CY.

Also, the handshake module, e.g., $\mathbf{3113}_k$ is configured to send repeatedly said data strobe encoded frequency correction signal, e.g., DFR_OUT[k], DFR_OUT_STB[k] asserted to command frequency correction of the respective cluster transmitters, e.g., $\mathbf{14}_1, \ldots, \mathbf{14}_m$.

Also, the handshake module, e.g., $\mathbf{3113}_k$ can alternatively be configured to send once said data strobe encoded frequency correction signal, e.g., DFR_OUT[k], DFR_OUT_STB[k] asserted to command frequency correction of the respective cluster transmitters, e.g., $\mathbf{14}_1, \ldots, \mathbf{14}_m$, the transmitter performing the frequency correction over said programmed said number of cycles, e.g., CY.

Also, upon receival of said set of asserted acknowledge signals, e.g., DS_DFR_ACK from all the enabled transmitters, e.g., $\mathbf{14}_1, \ldots, \mathbf{14}_m$ of the cluster, e.g., $CLT_k$ acknowledging performing a frequency correction, e.g., ND+DFR on the frequency of all the independent PLL circuits, e.g., $PL_1, \ldots, PL_m$ of the corresponding cluster, e.g., $CLT_k$ said handshake module, e.g., $\mathbf{3113}_k$ is configured to implement a handshake communication protocol also with said digital core module, e.g., 50 which sends to said handshake module, e.g., $\mathbf{3113}_k$ said frequency correction, e.g., DFR obtained, e.g., 57*k* from a detected phase error, e.g., PE, sending a respective cluster frequency correction acknowledge signal, e.g., DFM_DFR_ACK[k] to said core module, e.g., 50, said cluster frequency correction sub-module acknowledge signal, e.g., DFM_DFR_ACK[k] enabling said core, e.g., 50 to send a next frequency correction, e.g., DFR.

As mentioned another aspect refers to implementing the PLL circuit, e.g., $PL_1, \ldots, PL_m$, by fractional sigma delta PLL circuits comprising a respective sigma delta modulator, e.g., $SM_1, \ldots, SM_m$ comprising a respective handshake module $HS_i$ configured to receive the data strobe encoded data-slice frequency correction DFM_DFR[i], DFM_DFR_STB[i] signal commanding a frequency correction DFRV, the sigma delta modulator, $SM_i$, being configured to modify its input with said frequency correction DFRV, in particular for said number (CY) of cycles, repeatedly or not, in particular the sigma delta modulator $SM_i$ being configured to modify its input with the frequency correction DFRV, in particular as a consequence, the sigma-delta modulator $SM_i$ outputting a modified pseudo-random sequence of integer division ratios, to the respective PLL loop $PL_i$ of said PLL circuit $PL_1, \ldots, PL_m$, e.g., sending to the loop divider $FD_i$ a modified sequence of integer values, in average corresponding to the nominal value ND summed to the frequency correction DFRV, the sum being the averaging effect of the operation of the sigma delta modulator $SM_i$, received in the data strobe encoded data-slice frequency correction DFM_DFR[i], DFM_DFR_STB[i] signal commanding a frequency correction.

Also, the frequency correction sub-module 311$_k$ may comprise a synchronizer 3114$_k$ to synchronize said set, in particular a bus, of acknowledge signals DS_DFR_ACK with the cluster clock signal, e.g., chosen in the set of clocks, e.g., CSF, CSA, CSC.

A further synchronizer, e.g., 3111$_k$ may be provided to synchronize the frequency correction signal DFR[k], DFR_STB[k] sent from said digital core 50 with said cluster clock signal e.g., chosen in the set of clocks CSF, CSA, CSC, in particular synchronize a strobe of said frequency correction signal DFR[k], DFR_STB[k].

It is underlined that the gap insertion usually, rather than being set, derives by the handshake protocol based on a number CY of cycles, i.e., when latest acknowledge signal DS_DFR_ACK[i] terminates the number CY of cycles, it de-asserts, and this drives all the strobe DFM_DFR_STB[i] assertions in the cluster. Each assertion is a long time gap away from the strobe DFM_DFR_STB[i] previous de-assertion, due to the number CY of cycles being much higher than one, minimum is e.g., 128 cycles. Such respective strobe DFM_DFR_STB[i] assertion, in turns drives a new assertion for the acknowledge signal DS_DFR_ACK[i] (just a few cycles after its previous de-assertion).

From the description here above thus the advantages of the solution described are apparent.

The solution here described allows less area consumption, as the digital frequency correction module is serving all data path instead of having path-dedicated Phase Interpolators.

Also, the solution here described allows less power consumption as the digital frequency correction module is a digital block at low frequency. Phase Interpolators are managing a high-speed clock. This also allows a higher data-rate with less complexity. As a consequence, the solution here described determines costs saving because of the lower area and power consumption.

Also, the solution here described minimizes latency with less complexity. The digital frequency correction module receives the input from one detecting loop only, while each Phase Interpolators is controlled by a dedicated data-path loop.

Also, the solution determines a negligible additional noise injection.

Also, the solution here described allows intrinsically managing both frequency and phase update.

The solution with phase interpolators may be affected by systematic non-linear error due to intrinsic non-linear behavior of the interpolation itself. Also known as Integral Non-Linearity, this error impairs the Bit-Error-Rate overall performances, especially with higher data-rate SerDes devices.

The here proposed solution relies instead on frequency correction assessed through a closed-loop control for just one data-path and applied to all the data-paths. In such a solution an unexpected behavior could arise when applying a sequence of frequency correction commands to many PLLs at possible different timings for different duration, causing PLL independent phase shifts which can cumulate to unbounded phase difference between PLLs. In order to guarantee bounded phase difference between PLLs, the frequency command duration is controlled and common to all the PLLs (i.e., controlled phase shifts) and a further mechanism, such as the here proposed hand-shake, is put in place. Guaranteeing bounded phase difference allows to keep data consistency across data read and write ports of the FIFO architecture in the digital core. This data consistency allows to read aggregate data, i.e., data which are aggregated into a cluster for the purpose of consistency.

The digital frequency correction module, with its clock domain per cluster (e.g., DFM_CLK[k]) is able to interface asynchronous subsystems using a clock to raise the strobe from the core (e.g., DFR_STB (k)) and using the clocks employed to clock the sigma delta modulators (which in its turn comprises many clock subdomains, due to independent transitions of the different sigma delta modulators clocks of a cluster. For the domain of the clock to raise the strobe from the core (e.g., DFR_STB (k)), it may be based on the recovered clock e.g., DRC) or another clock local to the digital core, 50. The digital frequency correction module according to the solution described, in any case, is able to interface these asynchronous domains, regardless of their exact frequency, in particular through the handshake mechanism of strobe/acknowledge on both sides (the first one being on the core interface, the second one being on the data-slices, or transmitters, sigma-delta interfaces).

Without prejudice to the underlying principles, the details and embodiments may vary, even significantly, with respect to what has been described by way of example only, without departing from the extent of protection.

The solution here described may be used with any number of transmitters at the output of the SerDes.

High speed and high data rate are in general referred to speed and data rates which may determine the problem above described and solved by the present solution. In the example Gbit/s data rates are indicated, but the solution is not limited to that range, and of course can be used at lower data rates.

The claims are an integral part of the technical disclosure of the embodiments as provided herein.

The extent of protection is defined by the annexed claims.

The invention claimed is:

1. An electronic digital system, comprising:

a digital core;

a Serializer Deserializer module;

said digital core comprising a first in first out (FIFO) architecture device that is written to with a write clock and configured to transmit parallel data, and read from with a read clock, on a set of buses coupled to said Serializer Deserializer module;

said Serializer Deserializer module configured to transmit said parallel data read from said FIFO architecture device as a corresponding set of serial signals transmitted by a respective set of transmitters, said set of serial signals and the corresponding set of transmitters being logically grouped according to one or more clusters corresponding to one or more groups of buses;

said set of transmitters comprising respective independent phase lock loop (PLL) circuits issuing respective PLL clock signals, using as reference a cluster transmitter reference clock common to a respective cluster of transmitters controlling a frequency of serialization operation of said transmitters and a set of low frequency clock signals obtained by said PLL clock signals through frequency division;

a digital frequency correction module configured to supply to each independent PLL circuit a data strobe encoded frequency correction signal specifying a frequency correction dependent on a detected phase error, between the write clock and the read clock, said read clock corresponding to one low frequency clock signal of said set of low frequency clock signals;

said digital frequency correction module comprising one or more cluster digital frequency correction sub-modules each corresponding to a respective cluster, clocked by a respective cluster clock signal, corresponding to said cluster transmitter reference clock, configured to receive and process a respective data strobe encoded cluster frequency correction comprising said frequency correction dependent on the detected phase error, outputting a respective correction signal from which data strobe encoded frequency correction signals for each of said transmitters are obtained by demultiplexing;

wherein each of said transmitters is configured to assert respective acknowledge signals when receiving said respective data strobe encoded frequency correction signals specifying a frequency correction; and wherein each cluster digital frequency correction sub-module comprises a handshake module receiving a set of said acknowledge signals by the transmitters of the cluster, which are resynchronized with said cluster clock signal, said handshake module being configured to issue said output data strobe encoded frequency correction signal as asserted to specify frequency correction of the respective transmitters upon receival of a set of de-asserted acknowledge signals, resynchronized with said cluster clock signal, from all enabled transmitters of the cluster, said transmitters being configured to de-assert said acknowledge signals upon completion of a number of cycles of a frequency correction on the frequency of all the independent PLL circuits of the corresponding cluster.

2. The system of claim 1, wherein said frequency correction is obtained from a phase error detected by an error detection module comprised in said digital core.

3. The system of claim 1, wherein said transmitters of a cluster are programmable with a same number of cycles and are configured to maintain the respective acknowledge signals from all the enabled transmitters asserted for a duration corresponding to said number of cycles.

4. The system of claim 1, wherein said handshake module is configured to repeatedly send said data strobe encoded frequency correction signal asserted to specify frequency correction of the transmitters of a cluster; and wherein said transmitter is configured to perform the frequency correction over said number of cycles.

5. The system of claim 1, wherein upon receipt of said set of asserted resynchronized acknowledge signals, from all the enabled transmitters of the cluster acknowledging performing a frequency correction on the frequency of all the independent PLL circuits of the corresponding cluster, said handshake module is configured to implement a handshake communication protocol also with said digital core module which sends to said cluster digital frequency correction sub-module said frequency correction obtained from a detected phase error, said handshake module sending a respective cluster frequency correction acknowledge signal to said core module, said cluster frequency correction sub-module acknowledge signal enabling said core to send a next frequency correction.

6. The system of claim 1, wherein said write clock is a recovered clock signal recovered from data received upstream of said FIFO architecture device.

7. The system of claim 1, wherein said independent PLL circuits are implemented by fractional sigma delta PLL circuits, comprising a respective sigma delta modulator comprising a respective handshake module configured to receive said data strobe encoded frequency correction signals for each of said transmitters specifying a frequency correction, said sigma delta modulator being configured to modify its input with said frequency correction.

8. The system of claim 1, wherein said each frequency correction sub-module comprises:

a first synchronizer configured to synchronize said set of acknowledge signals with said cluster clock signal;

a filter which filters the resynchronized frequency correction signal before entering said handshake module; and a second synchronizer configured to synchronize said frequency correction signal from said digital core with said cluster clock signal by synchronizing a strobe of said frequency correction signal.

9. The system of claim 1, wherein the set of cluster digital frequency correction sub-modules is configured to send a data strobe encoded output signal to a Cluster to Logical Data-Slice cross-bar configured to issue said data strobe encoded frequency correction request signal to said transmitters based on their grouping, under the control of a configuration bus signal, which indicates to which cluster each data slice belongs, issued by said register map, which is in particular programmable.

10. The system of claim 1, wherein said digital frequency correction module comprises a map register module in which the grouping in cluster is stored.

11. The system of claim 1, wherein said phase error is supplied as frequency correction between such signals by a correction module which applies a proportional integral phase correction having the phase error as input, followed by a differentiation and issuing said data strobe encoded frequency correction signal.

12. The system of claim 1, wherein the digital frequency correction module comprises a configuration manager that is configured to indicate, for each cluster which transmitter is active on the basis of a setting signal, which cluster each transmitter belongs to, and on the basis of a setting signal indicating which transmitter is enabled.

13. The system of claim 1, wherein said transmitter reference clock is selected from a set of available clock signals and said cluster digital frequency correction sub-module is clocked by a clock selected from said set of available clock signals corresponding to the transmitter reference clock selected for the corresponding cluster.

14. A Serializer Deserializer module, comprising:

an input configured to receive received parallel data read in response to a read clock on a set of buses coupled to said Serializer Deserializer module;

a respective set of transmitters configured to transmit said parallel data as a corresponding set of serial signals, said set of serial signals and the corresponding transmitters being logically grouped according to one or more clusters corresponding to one or more groups of said buses;

said set of transmitters comprising respective independent phase lock loop (PLL) circuits issuing respective PLL clock signals, using as reference a cluster transmitter reference clock common to a respective cluster of transmitters controlling a frequency of serialization operation of said transmitters and a set of low frequency clock signals obtained by said PLL clock signals using frequency division;

a digital frequency correction module configured to supply to each independent PLL circuit a data strobe encoded frequency correction signal specifying a frequency correction depending from a detected phase error, between the write clock and the read clock, said read clock corresponding to one of said PLL clock signals;

said digital frequency correction module comprising one or more cluster digital frequency correction sub-modules each corresponding to a respective cluster, clocked by a respective cluster clock signal, corresponding to said cluster transmitter reference clock, configured to receive and process a respective data strobe encoded cluster frequency correction comprising said frequency correction depending from the detected phase error, outputting a respective correction signal from which data strobe encoded frequency correction signals for each of said transmitters are obtained by demultiplexing;

wherein each of said transmitters is configured to assert respective acknowledge signals when receiving said respective data strobe encoded frequency correction signals specifying a frequency correction;

wherein each cluster digital frequency correction sub-module comprises a handshake module receiving a set of said acknowledge signals by the transmitters of the cluster, which are resynchronized with said cluster clock signal, said handshake module being configured to issue said output data strobe encoded frequency correction signal as asserted to specify frequency correction of the respective transmitters upon receival of a set of de-asserted acknowledge signals, resynchronized with said cluster clock signal, from all enabled transmitters of the cluster, said transmitters being configured to de-assert said acknowledge signals upon completion of a number of cycles of a frequency correction on the frequency of all the independent PLL circuits of the corresponding cluster.

15. The module of claim 14, wherein said transmitters of a cluster are programmable with a same number of cycles and are configured to maintain the respective acknowledge signals from all the enabled transmitters asserted for a duration corresponding to said number of cycles.

16. The module of claim 14, wherein said handshake module is configured to repeatedly send said data strobe encoded frequency correction signal asserted to specify frequency correction of the transmitters of a cluster; and wherein said transmitter is configured to perform the frequency correction over said number of cycles.

17. The module of claim 14, wherein upon receipt of said set of asserted resynchronized acknowledge signals, from all the enabled transmitters of the cluster acknowledging performing a frequency correction on the frequency of all the independent PLL circuits of the corresponding cluster, said handshake module is configured to implement a handshake communication protocol also with said digital core module which sends to said cluster digital frequency correction sub-module said frequency correction obtained from a detected phase error, said handshake module sending a respective cluster frequency correction acknowledge signal to said core module, said cluster frequency correction sub-module acknowledge signal enabling said core to send a next frequency correction.

18. The system of claim 14, wherein said independent PLL circuits are implemented by fractional sigma delta PLL circuits, comprising a respective sigma delta modulator comprising a respective handshake module configured to receive said data strobe encoded frequency correction signals for each of said transmitters specifying a frequency correction, said sigma delta modulator being configured to modify its input with said frequency correction.

19. The module of claim 14, wherein said each frequency correction sub-module comprises:

a first synchronizer configured to synchronize said set of acknowledge signals with said cluster clock signal;

a filter which filters the resynchronized frequency correction signal before entering said handshake module; and a second synchronizer configured to synchronize said frequency correction signal from said digital core with said cluster clock signal by synchronizing a strobe of said frequency correction signal.

20. The module of claim 14, wherein the set of cluster digital frequency correction sub-modules is configured to send a data strobe encoded output signal to a Cluster to Logical Data-Slice cross-bar configured to issue said data strobe encoded frequency correction request signal to said transmitters based on their grouping, under the control of a configuration bus signal, which indicates to which cluster each data slice belongs, issued by said register map, which is in particular programmable.

21. The module of claim 14, wherein said phase error is supplied as frequency correction between such signals by a correction module which applies a proportional integral phase correction having the phase error as input, followed by a differentiation and issuing said data strobe encoded frequency correction signal.

* * * * *